(12) United States Patent  
Chang et al.

(10) Patent No.: US 9,546,278 B2
(45) Date of Patent: Jan. 17, 2017

(54) PORPHYRIN PHOTOSENSITIVE DYE AND PHOTOELECTRIC CONVERSION DEVICE UTILIZING THE SAME

(71) Applicant: Industrial Technology Research Institute, Hsinchu (TW)

(72) Inventors: Shu-Nung Chang, Taichung (TW); Chia-Hua Lee, Taichung (TW); Yung-Liang Tung, Zhudong Township (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 14/620,715

(22) Filed: Feb. 12, 2015

(65) Prior Publication Data
US 2016/0009921 A1    Jan. 14, 2016

(30) Foreign Application Priority Data
Jul. 9, 2014    (TW) .............................. 103123578 A

(51) Int. Cl.
C07D 487/22    (2006.01)
C09B 47/00    (2006.01)
H01L 51/00    (2006.01)
H01G 9/20    (2006.01)
H01L 51/50    (2006.01)

(52) U.S. Cl.
CPC ............ *C09B 47/00* (2013.01); *H01G 9/2059* (2013.01); *H01L 51/0092* (2013.01);
(Continued)

(58) Field of Classification Search
None
See application file for complete search history.

(56) References Cited

U.S. PATENT DOCUMENTS

2010/0125136 A1    5/2010    Yeh et al.
2013/0090469 A1    4/2013    Yeh et al.

FOREIGN PATENT DOCUMENTS

CN    102827169 A    12/2012
CN    103044952 A    4/2013
(Continued)

OTHER PUBLICATIONS

Carlo et al. "Tetraaryl ZnII Porphyrinates Substituted at β-Pyrrolic Positions as Sensitizers in Dye-Sensitized Solar Cells: A Comparison with meso-Disubstituted Push—Pull ZnII Porphyrinates", Chemistry, A European Journal, 2013, 19, 10723-10740.
(Continued)

*Primary Examiner* — Brian McDowell
(74) *Attorney, Agent, or Firm* — Birch, Stewart, Kolasch & Birch, LLP

(57) ABSTRACT

Disclosed is a porphyrin photosensitive dye, having the chemical formula:

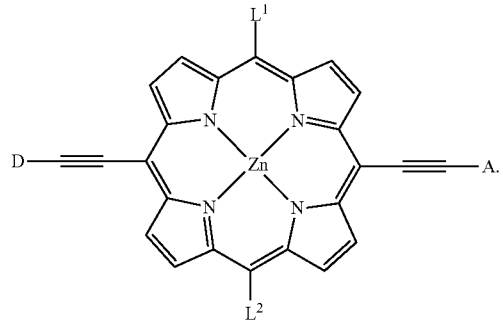

Each of $L^1$ and $L^2$ is independently

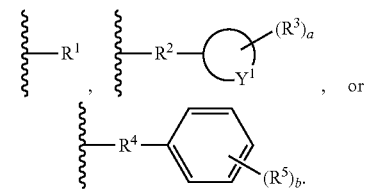

$R^1$ is $C_{5-20}$ linear/branched alkyl group. $R^2$ is $C_{0-20}$ linear/branched alkyl group. $R^4$ is $C_{1-20}$ linear/branched alkyl group. Each of $R^3$ and $R^5$ is independently $C_{1-20}$ linear/branched alkyl group or $C_{1-20}$ linear/branched alkoxy group. $Y^1$ is $C_{3-20}$ cycloalkyl group. Each of a and b is independently an integer of 0 to 5. D is

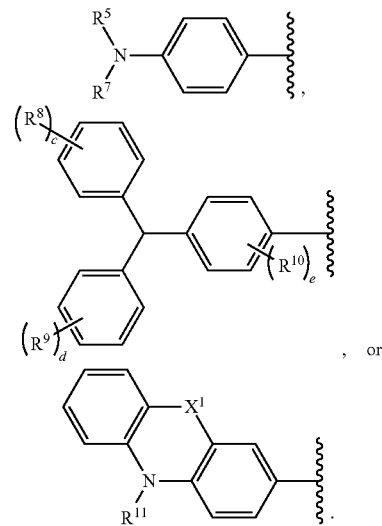

Each of $R^6$ to $R^{11}$ is independently $C_{1-10}$ alkyl group. $X^1$ is N, O, S, or Se. Each of c, d, and e is independently an integer of 0 to 5. A is

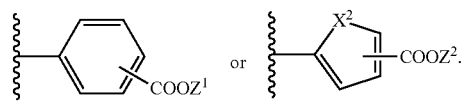

Each of $Z^1$ and $Z^2$ is independently hydrogen, alkali metal, or quaternary ammonium salt —$N(R^{12})_4$. $R^{12}$ is $C_{1-10}$ alkyl group. $X^2$ is N, O, S, or Se.

13 Claims, No Drawings

(52) U.S. Cl.
CPC ........ *H01G 9/2031* (2013.01); *H01L 51/5012* (2013.01); *Y02E 10/542* (2013.01); *Y02E 10/549* (2013.01)

(56) References Cited

FOREIGN PATENT DOCUMENTS

| TW | 201020254 A1 | 6/2010 |
| TW | 201315735 A | 4/2013 |
| WO | WO 2006/038823 A1 | 4/2006 |
| WO | WO 2012/165641 A1 | 12/2012 |

OTHER PUBLICATIONS

Lee et al. "Novel Zinc Porphyrin Sensitizers for Dye-Sensitized Solar Cells: Synthesis and Spectral, Electrochemical, and Photovoltaic Properties", Chem. Eur. J. 2009, 15, 1403-1412.

Luo et al. "Effects of aggregation and electron injection on photovoltaic performance of porphyrin-based solar cells with oligo(phenylethynyl) links inside TiO2 and Al2O3 nanotube arrays", Physical Chemistry Chemical Physics, 2010, 12, 1064-1071.

Wang et al. "Donor-acceptor copolymer based on dioctylporphyrin: Synthesis and application in organic field-effect transistors", Polymer, 53, (2012), 1864-1869.

Xue et al. "Effect of the length of the alkyl chains in porphyrin meso-substituents on the performance of dye-sensitized solar cells", RSC Advances, 2014, 4, 8894-8900.

Yella et al. "Porphyrin-Sensitized Solar Cells with Cobalt (II/III)—Based Redox Electrolyte Exceed 12 Percent Efficiency", Science 334, 629 (2011).

Taiwan Office Action for Appl. No. 103123578 dated Feb. 12, 2015.

PORPHYRIN PHOTOSENSITIVE DYE AND PHOTOELECTRIC CONVERSION DEVICE UTILIZING THE SAME

CROSS REFERENCE TO RELATED APPLICATIONS

The present application is based on, and claims priority from, Taiwan Application Serial Number 103123578, filed on Jul. 9, 2014, the disclosure of which is hereby incorporated by reference herein in its entirety

TECHNICAL FIELD

The technical field relates to a dye, and in particular it relates to a porphyrin photosensitive dye applied in a photoelectric conversion device.

BACKGROUND

Recently, the increased demand for sustainable and renewable energy resources have attracted much attention to the development of photovoltaic devices. While silicon-based solar cells require high-cost production processes, dye-sensitized solar cells (DSSC) are promising candidates for photovoltaic applications because of the low cost of raw materials and fabrication. For example, the most efficient polypyridine ruthenium-based DSSCs have achieved power conversion efficiency of more than 11%. However, drawbacks that include environmental concerns limit their applications in DSSC. Other than the ruthenium complexes in DSSC, some dyes may utilize molecules modified with a π-electron push-pull framework (e.g. commercially available porphyrin dyes) to improve charge separation and reduce the intra-molecular charge re-combination. The framework is beneficial for unifying the electron flow direction (such as from donor to acceptor and finally injection into the $TiO_2$ layer) to be applied in solar cells. Although the conventional dyes are not harmful to the environment, they are synthesized by using many steps and a long time, and are purified with difficulty. In short, these dyes cannot be easily prepared by mass-production.

SUMMARY

One embodiment of the disclosure provides a porphyrin photosensitive dye, having the chemical formula:

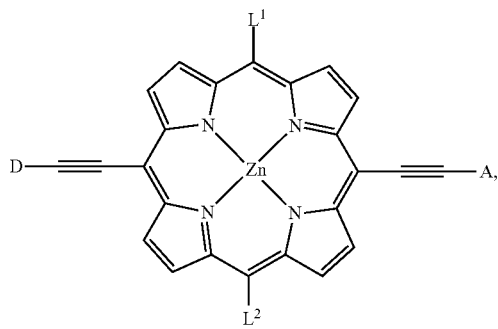

wherein each of $L^1$ and $L^2$ is independently

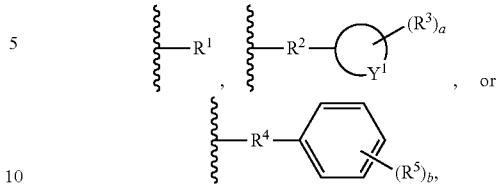

$R^1$ is $C_{5-20}$ linear or branched alkyl group, $R^2$ is $C_{0-20}$ linear or branched alkyl group, $R^4$ is $C_{1-20}$ linear or branched alkyl group, each of $R^3$ and $R^5$ is independently $C_{1-20}$ linear or branched alkyl group or $C_{1-20}$ linear or branched alkoxy group, $Y^1$ is $C_{3-20}$ cycloalkyl group, and each of a and b is independently an integer of 0 to 5; wherein D is

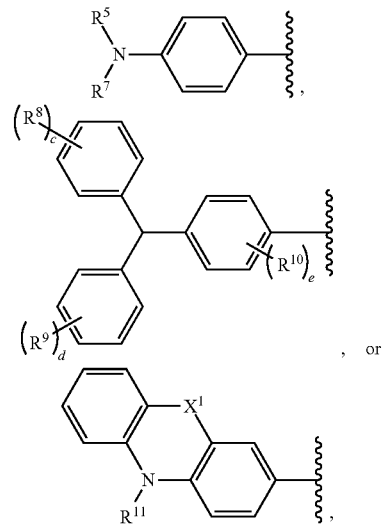

each of $R^6$ to $R^{11}$ is independently $C_{1-10}$ alkyl group, $X^1$ is N, O, S, or Se, and each of c, d, and e is independently an integer of 0 to 5; wherein A is

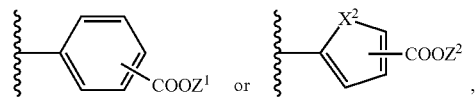

each of $Z^1$ and $Z^2$ is independently hydrogen, alkali metal, or quaternary ammonium salt —$N(R^{12})_4$, wherein $R^{12}$ is $C_{1-10}$ alkyl group, and $X^2$ is N, O, S, or Se.

One embodiment of the disclosure provides a photoelectric conversion device, comprising the described porphyrin photosensitive dye.

DETAILED DESCRIPTION

In the following detailed description, for purposes of explanation, numerous specific details are set forth in order to provide a thorough understanding of the disclosed embodiments. It will be apparent, however, that one or more embodiments may be practiced without these specific details.

The photosensitive dye made from easy processes, enhancing the efficiency of the DSSC, and especially remaining a basic photoelectric conversion of the DSSC is called for now.

The disclosure provides a dye with the chemical formula 1.

(Formula 1)

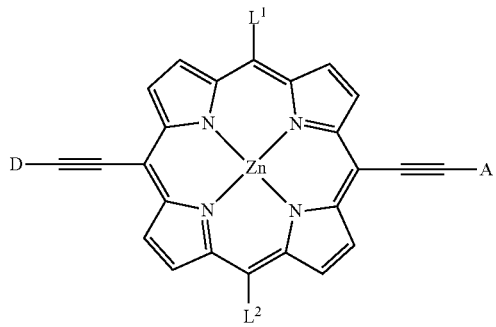

In formula 1, each of $L^1$ and $L^2$ is independently (Formula 2)

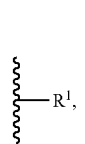

(Formula 3)

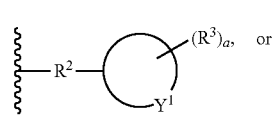

(Formula 4)

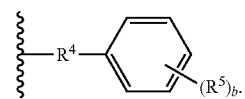

In Formulae 2-4, $R^1$ is $C_{5-20}$ linear or branched alkyl group, $R^2$ is $C_{0-20}$ linear or branched alkyl group, $R^4$ is $C_{1-20}$ linear or branched alkyl group, each of $R^3$ and $R^5$ is independently $C_{1-20}$ linear or branched alkyl group or $C_{1-20}$ linear or branched alkoxy group, $Y^1$ is $C_{3-20}$ cycloalkyl group, and each of a and b is independently an integer of 0 to 5.

In Formula 1, D is (Formula 5)

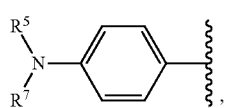

(Formula 6)

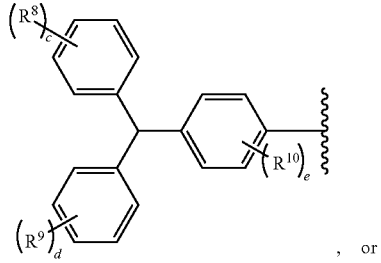

, or (Formula 7)

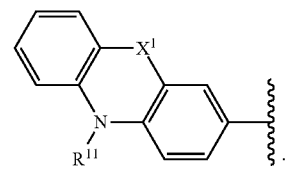

In Formulae 5 to 7, each of $R^6$ to $R^{11}$ is independently $C_{1-10}$ alkyl group, $X^1$ is N, O, S, or Se, and each of c, d, and e is independently an integer of 0 to 5.

In Formula 1, A is (Formula 8)

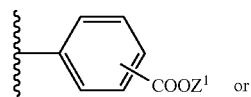

(Formula 9)

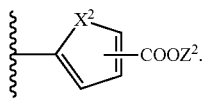

In Formulae 8 and 9, each of $Z^1$ and $Z^2$ is independently hydrogen, alkali metal, or quaternary ammonium salt —$N(R^{12})_4$, wherein $R^{12}$ is $C_{1-10}$ alkyl group, and $X^2$ is N, O, S, or Se.

One embodiment of the disclosure provides a photoelectric conversion device including the described dye. The photoelectric conversion device can be a flat display device (e.g. organic light-emitting diode), an organic photovoltaic device, or a solar cell (e.g. dye-sensitive solar cell, DSSC).

The above zinc porphyrin photosensitive dye can be synthesized in fewer steps and is easy to purify and mass produce. Moreover, the dye has a higher photoelectric conversion efficiency under weak light than that under strong light (e.g. 100% sunlight).

Below, exemplary embodiments will be described in detail so as to be easily realized by a person having ordinary knowledge in the art. The inventive concept may be embodied in various forms without being limited to the exemplary embodiments set forth herein. Descriptions of well-known parts are omitted for clarity.

EXAMPLES
Example 1 (Synthesis of C5 Dye)
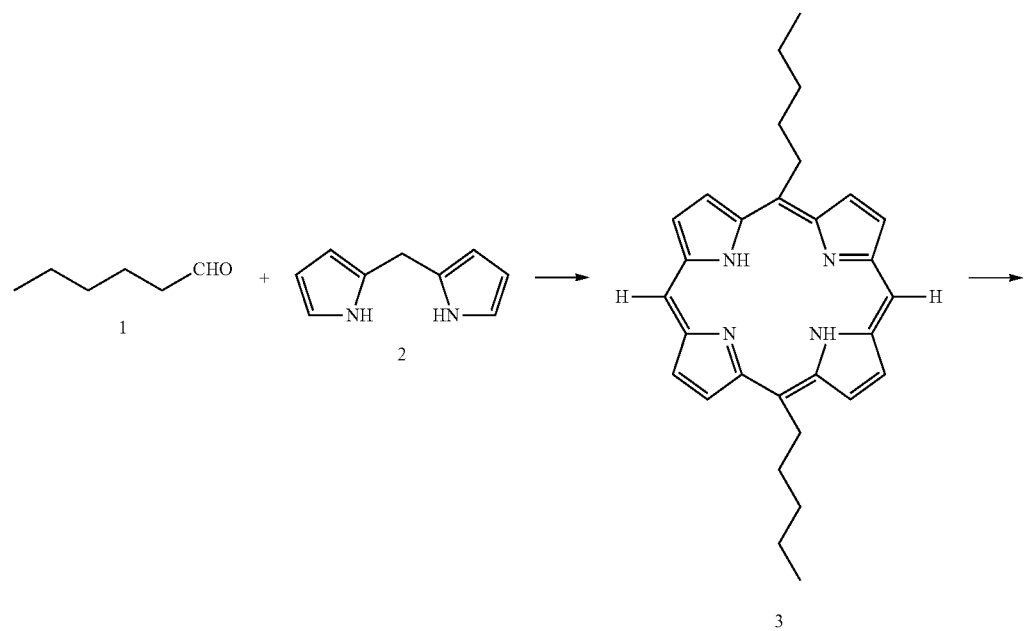
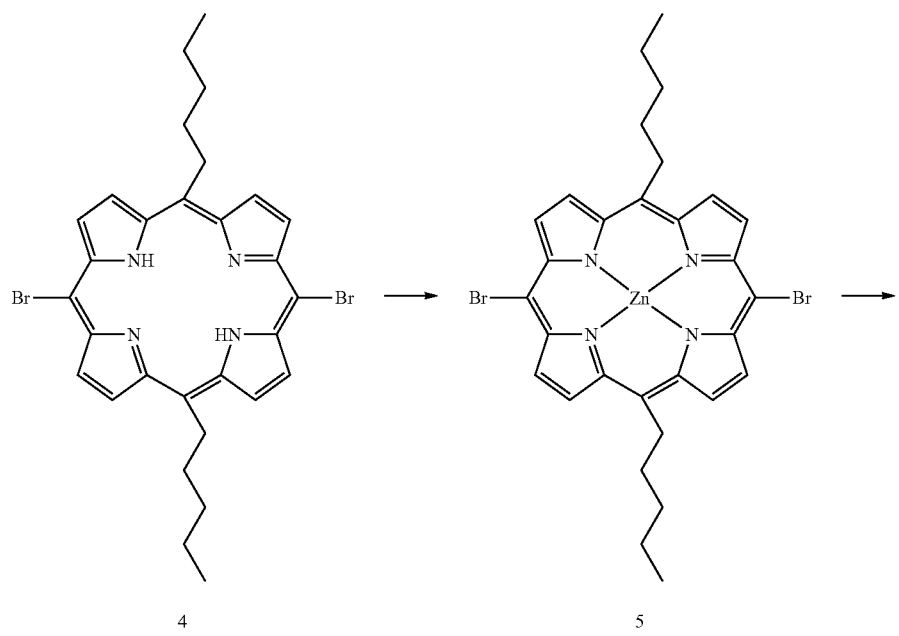

-continued
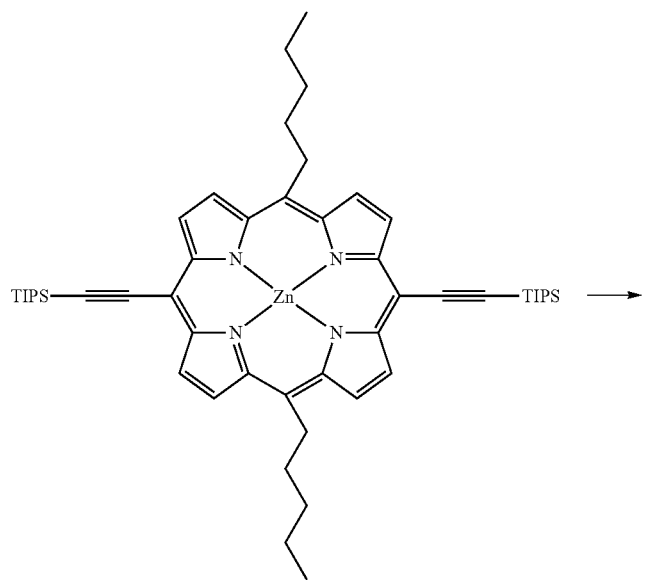
6
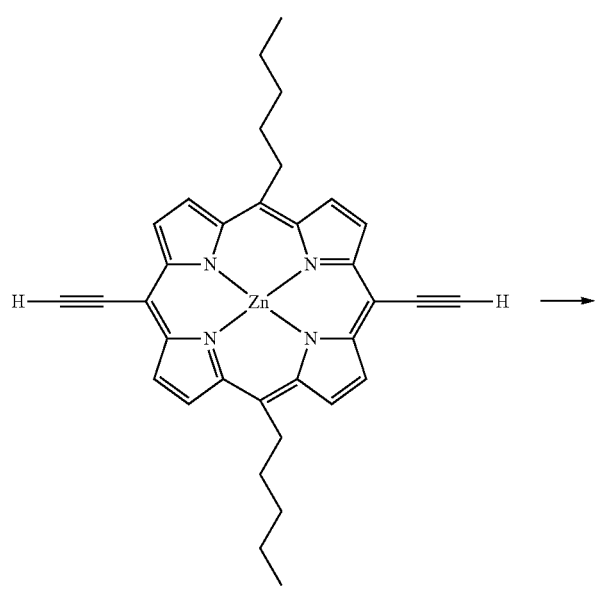
7

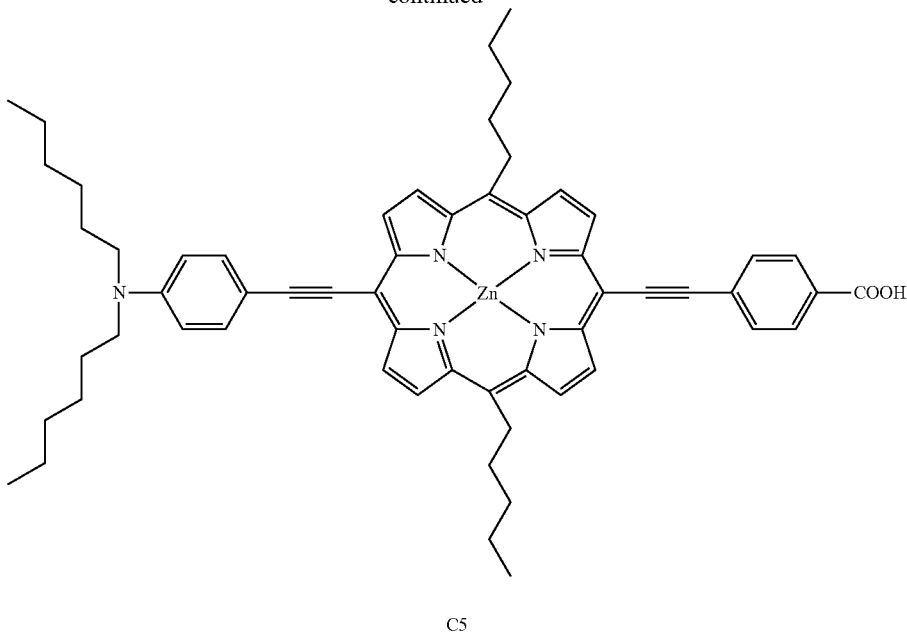

C5

(1) Synthesis of 5,15-dipentylporphyrin [3]

5 mmole of hexanal and 5 mmole of dipyrrolmethane were dissolved in 800 mL of dichloromethane and then evenly stirred. 10 g of montmorillonite K10 was then added to the solution in the dark, and the solution was reacted under nitrogen for 2 hours. 7.5 mmole of 2,3-Dichloro-5,6-dicyano-1,4-benzoquinone (DDQ) was then added into the solution to react for further 1.5 hours. The montmorillonite K10 in the result of reaction was removed by vacuum filtration through silica gel, and the filtrate was re-crystallized by methanol to obtain a purple-red porphyrin compound [3].

(2) Synthesis of 5,15-dibromo-10,20-dipentylporphyrin [4]

0.8 mmole of 5,15-dipentylporphyrin [3] was dissolved in 300 mL of dichloromethane and then evenly stirred. 2 mmole of N-bromosuccinimide (NBS) was added into the solution and then refluxed at 55° C. for 4 hours. The reaction was cooled to room temperature and then terminated by 30 mL of methanol. The result of the reaction was condensed by reduced pressure to obtain a crude. The crude was re-crystallized by methanol to obtain a porphyrin compound [4].

(3) Synthesis of (5,15-dibromo-10,20-dipentylporphyrinato)zinc(II) [5]

0.56 mmole of 5,15-dibromo-10,20-dipentylporphyrin [4] was dissolved in 140 mL of tetrahydrofuran (THF). 2.8 mmole of $Zn(OAc)_2 \cdot 2H_2O$ was dissolved in 20 mL of methanol. The methanol solution was added into the THF solution, and then heated to 55° C. and stirred at 55° C. overnight. The solvent in the result of the reaction was removed by reduced pressure condensation. The solid residue was washed by 45 mL of methanol and collected by filtration, thereby obtaining a porphyrin compound [5].

(4) Synthesis of 5,15-bis(triisopropylsilyl)ethynyl-10,20-dipentylporphyrinato) Zinc(II) [6]

0.33 mmole of the porphyrin compound, [5], 1.65 mmole of triisopropylsilylacetylene, 0.23 mmole of $Pd(PPh_3)_2Cl_2$, and 0.99 mmole of CuI were put in a reaction bottle. 20 mL of THF and 2 mL of triethyl amine ($NEt_3$) were added into the reaction bottle under nitrogen, and the mixture in the reaction bottle was stirred at room temperature for 17 hours to be reacted. The solvent in the result of the reaction was removed by reduced pressure condensation to obtain a crude. The crude was purified by chromatography with an eluent of dichloromethane/n-hexane (v/v-1:3) to obtain a purple solid of porphyrin compound [6].

(5) Synthesis of (5,15-dipentyl-10-(4-(N,N-dihexylamino)-phenylethynyl)-20-(4-carboxyphenylethynyl)porphyrinato) Zinc(II) [C5]

0.149 mmole of porphyrin compound [6] was dissolved in 10 mL of THF. 1.49 mL of 1M tetra-n-butylammonium fluoride solution (TBAF in THF) was then injected into the porphyrin compound [6] solution, and then stirred at room temperature for 60 minutes. A small amount of water was added into the reaction to terminate the reaction. The result of the reaction was extracted by water and dichloromethane. The organic layer of the extraction was collected and dried by anhydrous $MgSO_4$. The solvent of the organic layer was removed by condensation, thereby obtaining a porphyrin compound [7] for the next reaction.

0.149 mmole of 4-iodobenzoic acid, 0.045 mmole of Pd$_2$(dba)$_3$, and 0.37 mmole of AsPh$_3$ were added to the above porphyrin compound [7]. 0.149 mmole of N,N-dihexyl-4-iodobenzenamine and 20 mL of THF were mixed and then added into the mixture containing the porphyrin compound [7]. 4 mL of NEt$_3$ was then injected into the above mixture. The mixture was then heated to 70° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=20:1), and further recrystallized by n-hexane to obtain a green solid of porphyrin compound [C5].

The porphyrin compound [C5] was identified and analyzed as indicated below: $^1$H NMR (d-THF, 400 MHz) δ 9.74 (dd, 4H), 9.53 (dd, 4H), 8.24 (d, 2H), 8.14 (d, 2H), 7.85 (d, 2H), 6.88 (d, 2H), 5.00 (t, 4H), 3.46 (t, 4H), 1.55 (m, 8H), 1.42 (m, 16H), 0.96 (m, 16H).

Example 2 Synthesis of C10 Dye

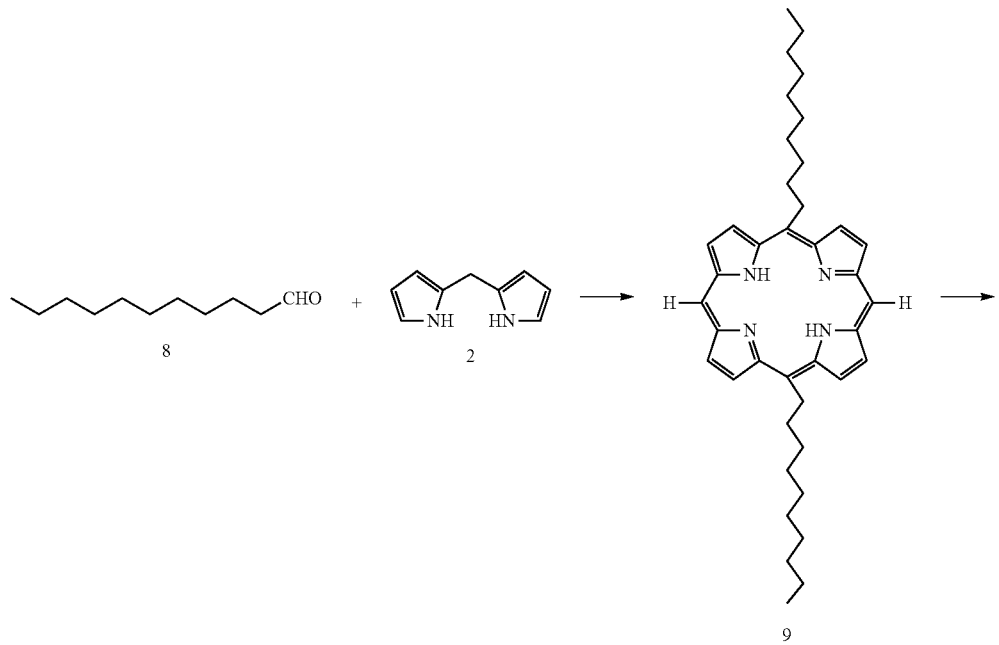

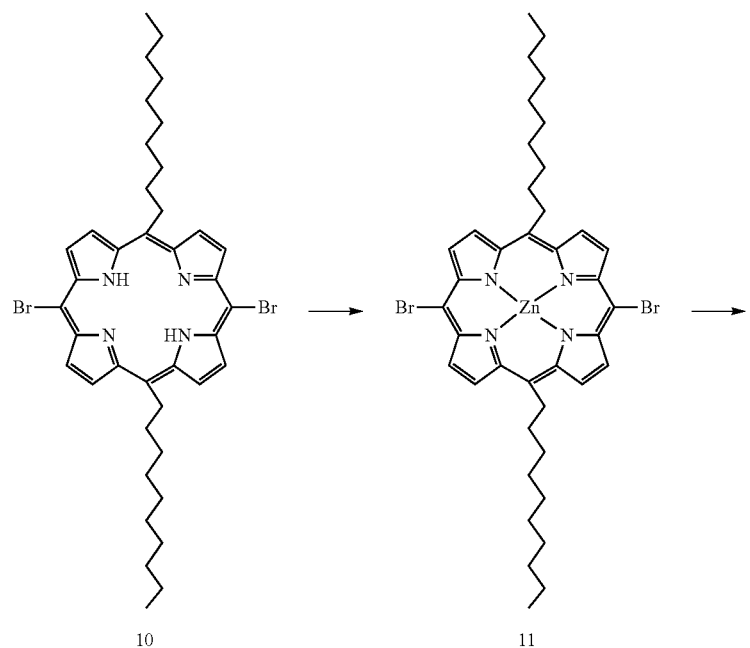

-continued

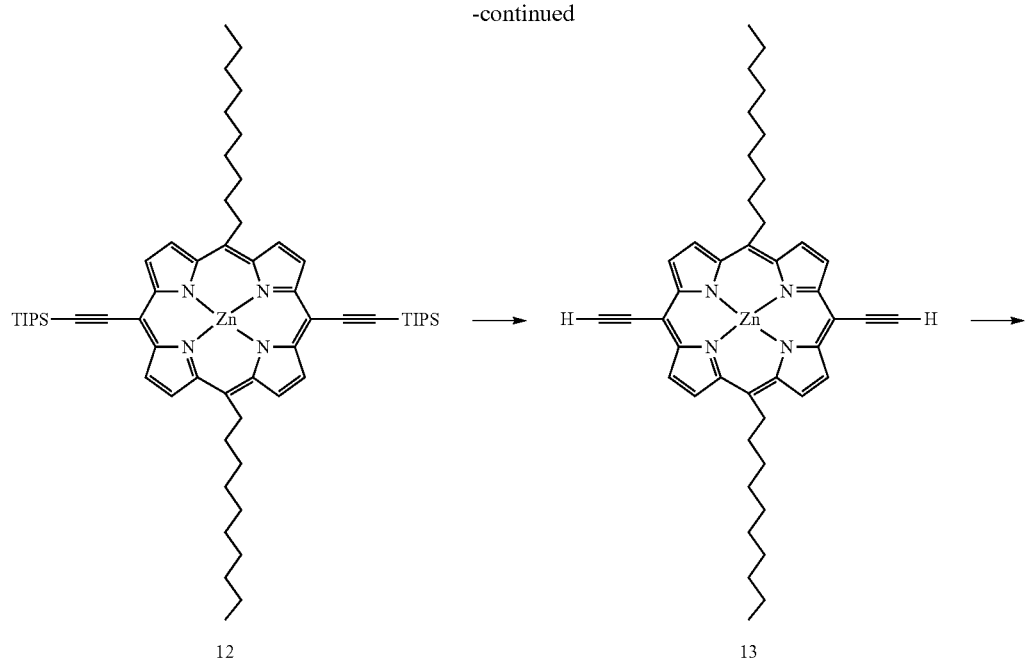

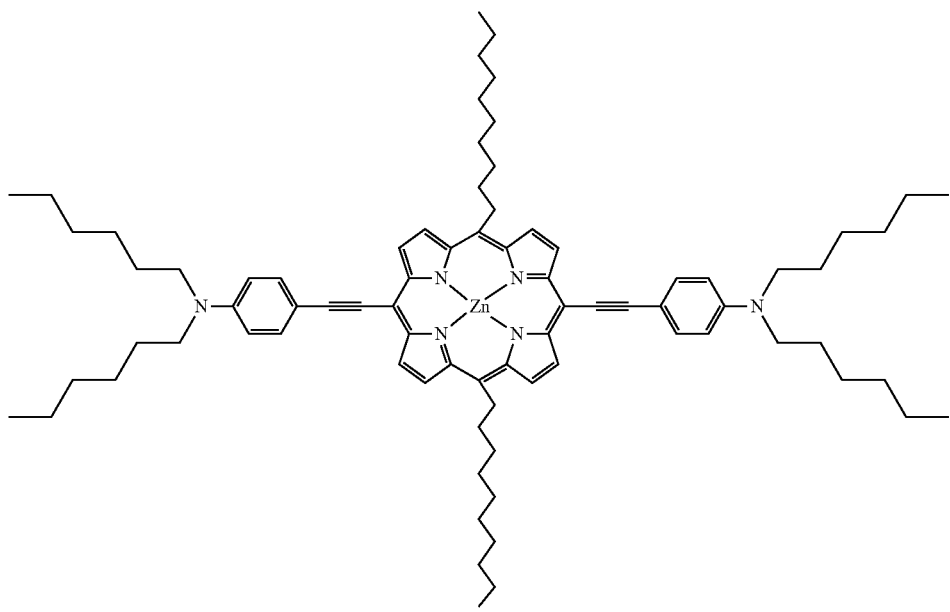

(1) Synthesis of 5,15-didecylporphyrin [9]

5 mmole of undecanal and 5 mmole of dipyrrolmethane were dissolved in 800 mL of dichloromethane and then evenly stirred. 10 g of montmorillonite K10 was then added to the solution in the dark, and the solution was reacted under nitrogen for 2 hours. 7.5 mmole of DDQ was then added into the solution to react for further 1.5 hours. The montmorillonite K10 in the result of reaction was removed by vacuum filtration through silica gel, and the filtrate was re-crystallized by methanol to obtain a purple-red porphyrin compound [9].

(2) Synthesis of 5,15-dibromo-10,20-didecylporphyrin [10]

0.85 mmole of 5,15-didecylporphyrin [9] was dissolved in 300 mL of dichloromethane and then evenly stirred. 1.87 mmole of NBS was added into the solution and then refluxed at 55° C. for 4 hours. The reaction was cooled to room temperature and then terminated by 30 mL of methanol. The result of the reaction was condensed by reduced pressure to obtain a crude. The crude was re-crystallized by methanol to obtain a porphyrin compound [10].

(3) Synthesis of (5,15-dibromo-10,20-didecylporphyrinato)zinc(II) [11]

0.25 mmole of 5,15-dibromo-10,20-didecylporphyrin [10] was dissolved in 57 mL of THF. 1.25 mmole of Zn(OAc)$_2$.2H$_2$O was dissolved in 7.6 mL of methanol. The methanol solution was added into the THF solution, and then heated to 55° C. and stirred at 55° C. overnight. The solvent in the result of the reaction was removed by reduced pressure condensation. The solid residue was washed by 20 mL of methanol and collected by filtration, thereby obtaining a porphyrin compound [11].

(4) Synthesis of (5,15-bis (triisopropylsilyl)ethynyl-10,20-didecylporphyrinato) Zinc(II) [12]

0.34 mmole of the porphyrin compound [11], 1.7 mmole of triisopropylacetylene, 0.1 mmole of Pd(PPh$_3$)$_2$Cl$_2$, and 0.42 mmole of CuI were put in a reaction bottle. 25 mL of THF and 2.5 mL of NEt$_3$ were added into the reaction bottle under nitrogen, and the mixture in the reaction bottle was stirred at room temperature for 17 hours to be reacted. The solvent in the result of the reaction was removed by reduced pressure condensation to obtain a crude. The crude was purified by chromatography with an eluent of dichloromethane/n-hexane (v/v=1:3) to obtain a purple solid of porphyrin compound [12].

(5) Synthesis of (5,15-didecyl-10-(4-(N,N-dihexylamino)-phenylethynyl)-20-(4-carboxyphenylethynyl)porphyrinato)Zinc(II) [C10]

0.155 mmole of porphyrin compound [12] was dissolved in 10 mL of THF. 1.55 mL of 1M TBAF solution (in THF) was then injected into the porphyrin compound [12] solution, and then stirred at room temperature for 60 minutes. A small amount of water was added into the reaction to terminate the reaction. The result of the reaction was extracted by water and dichloromethane. The organic layer of the extraction was collected and dried by anhydrous MgSO$_4$. The solvent of the organic layer was removed by condensation, thereby obtaining a porphyrin compound [13] for the next reaction.

0.155 mmole of 4-iodobenzoic acid, 0.047 mmole of Pd$_2$(dba)$_3$, and 0.39 mmole of AsPh$_3$ were added to the above porphyrin compound [13]. 0.155 mmole of N,N-dihexyl-4-iodobenzenamine and 20 mL of THF were mixed and then added into the mixture containing the porphyrin compound [13]. 4 mL of NEt$_3$ was then injected into the above mixture. The mixture was then heated to 70° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=20:1), and further re-crystallized by methanol to obtain a green solid of porphyrin compound [C10].

The porphyrin compound [C10] was identified and analyzed as indicated below: $^1$H NMR (d-THF, 400 MHz) δ 9.74 (dd, 4H), 9.52 (dd, 4H), 8.25 (d, 2H), 8.15 (d, 2H), 7.86 (d, 2H), 6.88 (d, 2H), 5.00 (t, 4H), 3.46 (t, 4H), 1.81 (m, 6H), 1.54 (m, 6H), 1.43-1.28 (m, 36H), 0.99-0.97 (m, 12H).

Example 3 (Synthesis of C3Ph Dye)

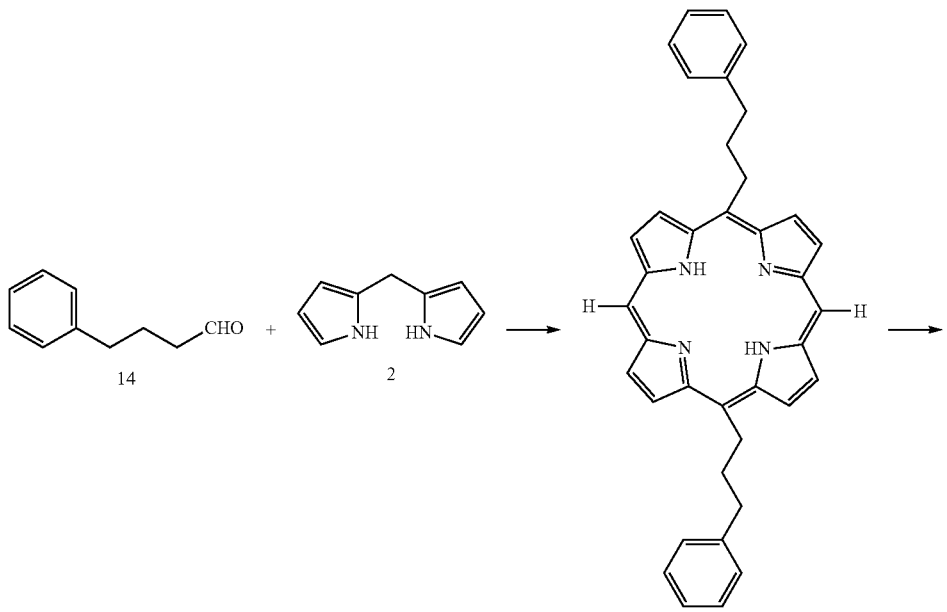

-continued
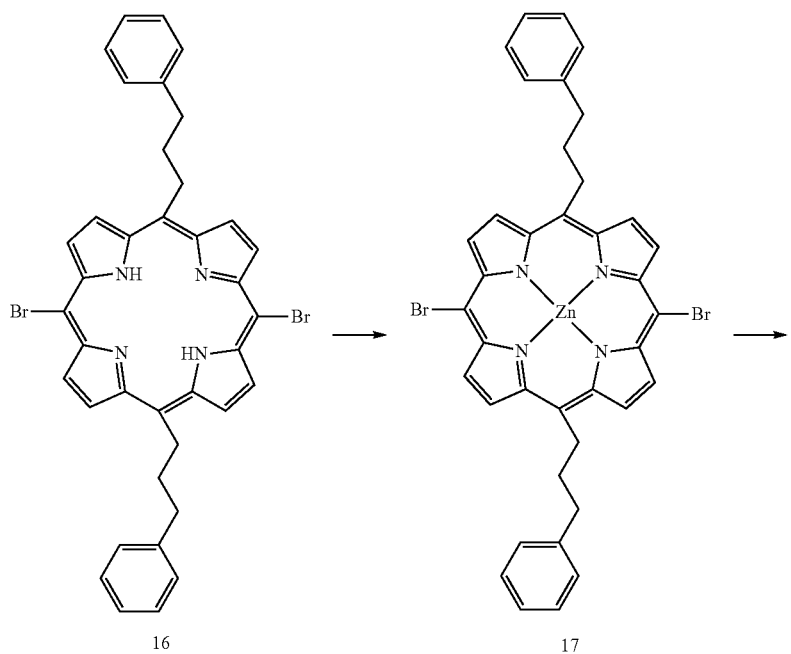
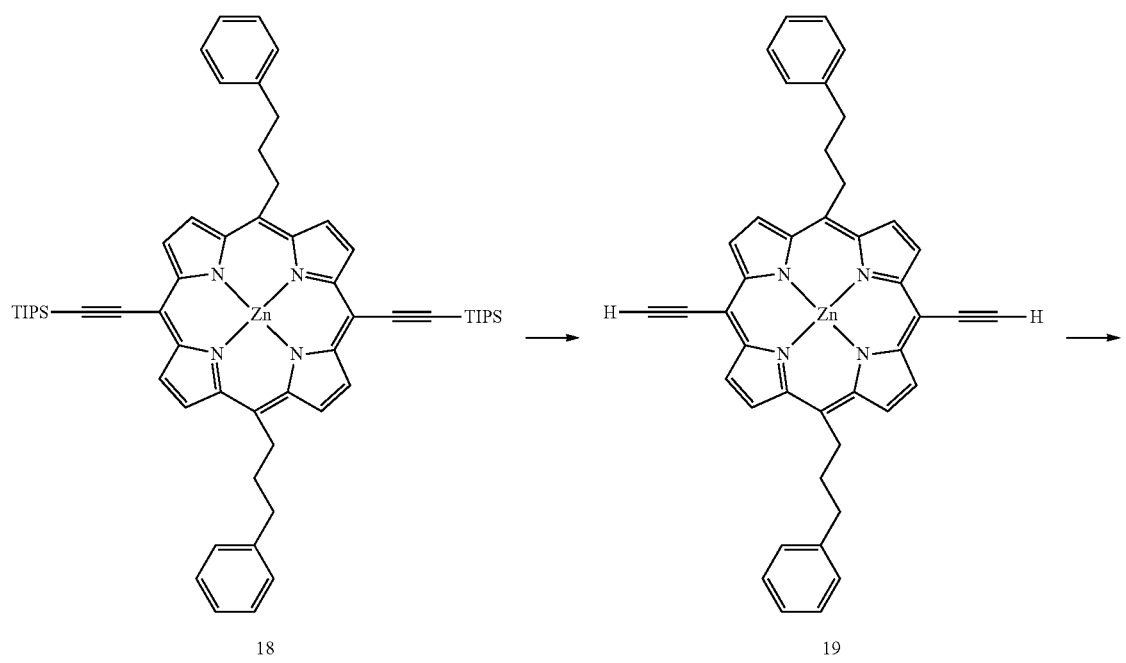

-continued

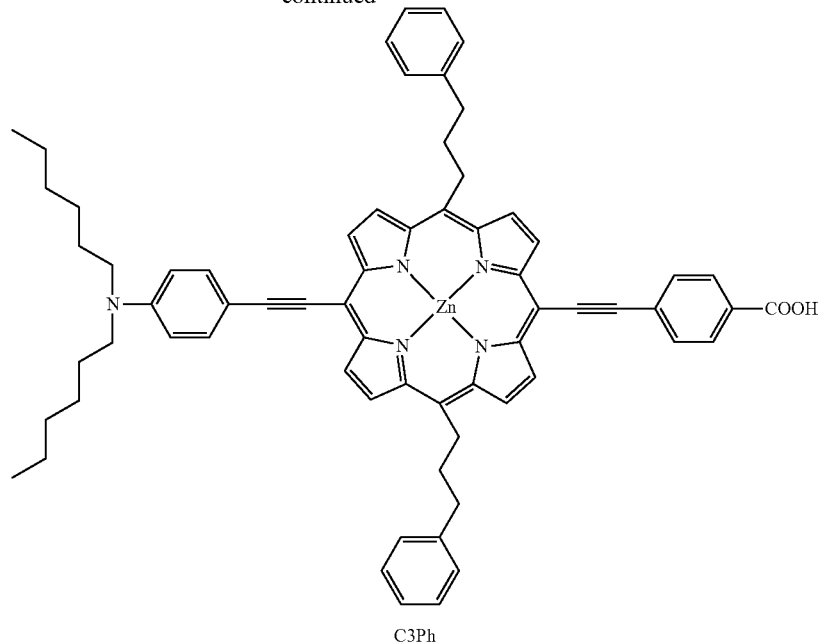

C3Ph (1) Synthesis of 5,15-di(3-phenylpropyl)porphyrin [15]

5 mmole of 4-phenylbutanal and 5 mmole of dipyrrolmethane were dissolved in 800 mL of dichloromethane and then evenly stirred. 10g of montmorillonite K10 was then added to the solution in the dark, and the solution was reacted under nitrogen for 2 hours. 7.5 mmole of DDQ was then added into the solution to react for further 1.5 hours. The montmorillonite K10 in the result of reaction was removed by vacuum filtration through silica gel, and the filtrate was re-crystallized by methanol to obtain a purple-red porphyrin compound [15].

(2) Synthesis of 5,15-dibromo-10,20-di(3-phenylpropyl)porphyrin [16]

1.04 mmole of 5,15-di(3-phenylpropyl)porphyrin [15] was dissolved in a mixture liquid of 400 mL of dichloromethane and 40 mL of THF and then evenly stirred. 2.6 mmole of NBS was added into the solution and then refluxed at 55° C. for 4 hours. The reaction was cooled to room temperature and then terminated by 40 mL of methanol. The result of the reaction was condensed by reduced pressure to obtain a crude. The crude was re-crystallized by methanol to obtain a porphyrin compound [16].

(3) Synthesis of (5,15-dibromo-10,20-di(3-phenylpropyl)porphyrinato) zinc(II) [17]

0.56 mmole of 5,15-dibromo-10,20-di(3-phenylpropyl) porphyrin [16] was dissolved in 50 mL of dimethylformamide (DMF) and evenly stirred. 2.24 mmole of $ZnCl_2$ was added into the DMF solution, and then heated to 140° C. and refluxed at 140° C. overnight. The reaction was cooled to room temperature, and then poured into 50 mL of water to form precipitate. The precipitation was collected by filtration, and washed by water and methanol to obtain a porphyrin compound [17].

(4) Synthesis of (5,15-bis(triisopropylsilyl)ethynyl-10,20-di(3-phenylpropyl)porphyrinato) Zinc(II) [18]

0.26 mmole of the porphyrin compound [17], 1.3 mmole of triisopropylacetylene, 0.26 mmole of $Pd(PPh_3)_2Cl_2$, and 1.04 mmole of CuI were put in a reaction bottle. 20 mL of THF and 2 mL of $NEt_3$ were added into the reaction bottle under nitrogen, and the mixture in the reaction bottle was stirred at room temperature for 17 hours to be reacted. The solvent in the result of the reaction was removed by reduced pressure condensation to obtain a crude. The crude was purified by chromatography with an eluent of dichloromethane/n-hexane (v/v=2:5) to obtain a purple solid of porphyrin compound [18].

(5) Synthesis of (5,15-di(3-phenylpropyl)-10-(4-(N, N-dihexylamino)-phenylethynyl)-20-(4-carboxyphenylethynyl)porphyrinato) Zinc(II) [C3Ph]

0.124 mmole of porphyrin compound [18] was dissolved in 10 mL of THF. 1.24 mL of 1M TBAF solution (in THF) was then injected into the porphyrin compound [18] solution, and then stirred at room temperature for 60 minutes. A small amount of water was added into the reaction to terminate the reaction. The result of the reaction was extracted by water and dichloromethane. The organic layer of the extraction was collected and dried by anhydrous $MgSO_4$. The solvent of the organic layer was removed by condensation, thereby obtaining a porphyrin compound [19] for the next reaction.

0.124 mmole of 4-iodobenzoic acid, 0.037 mmole of $Pd_2(dba)_3$, and 0.31 mmole of $AsPh_3$ were added to the above porphyrin compound [19]. 0.124 mmole of N,N-dihexyl-4-iodobenzenamine and 20 mL of THF were mixed and then added into the mixture containing the porphyrin compound [19]. 4 mL of $NEt_3$ was then injected into the above mixture. The mixture was then heated to 70° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=20:1) to obtain a green solid of porphyrin compound [C3Ph].

The porphyrin compound [C3Ph] was identified and analyzed as indicated below: $^1$H NMR (d-THF, 400 MHz) δ 9.70 (m, 4H), 9.40 (d, 2H), 9.36 (d, 2H), 8.25 (d, 2H), 8.13 (d, 2H), 7.85 (d, 2H), 7.34 (m, 8H), 7.23 (t, 2H), 6.87 (d, 2H), 4.99 (t, 4H), 3.46 (t, 4H), 3.12 (t, 4H), 2.84 (m, 6H), 1.43 (m, 14H), 0.97 (m, 6H).

Example 4 (Synthesis of CC6 Dye)
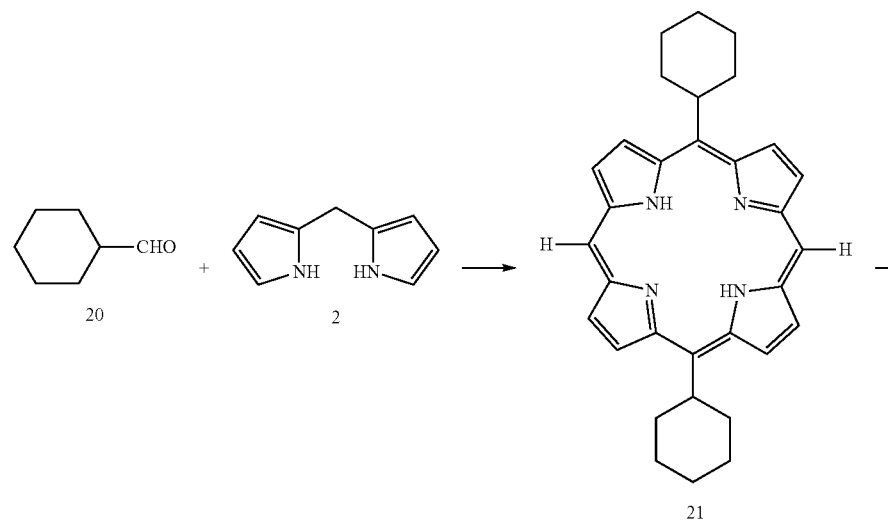
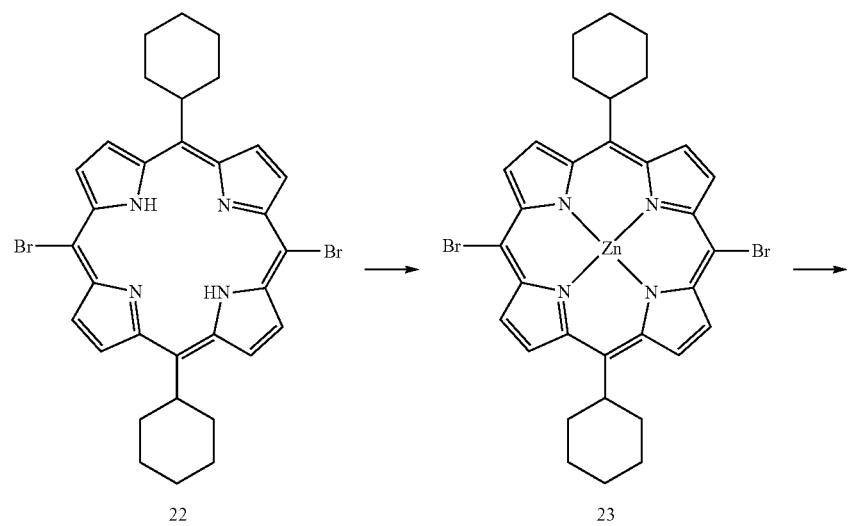
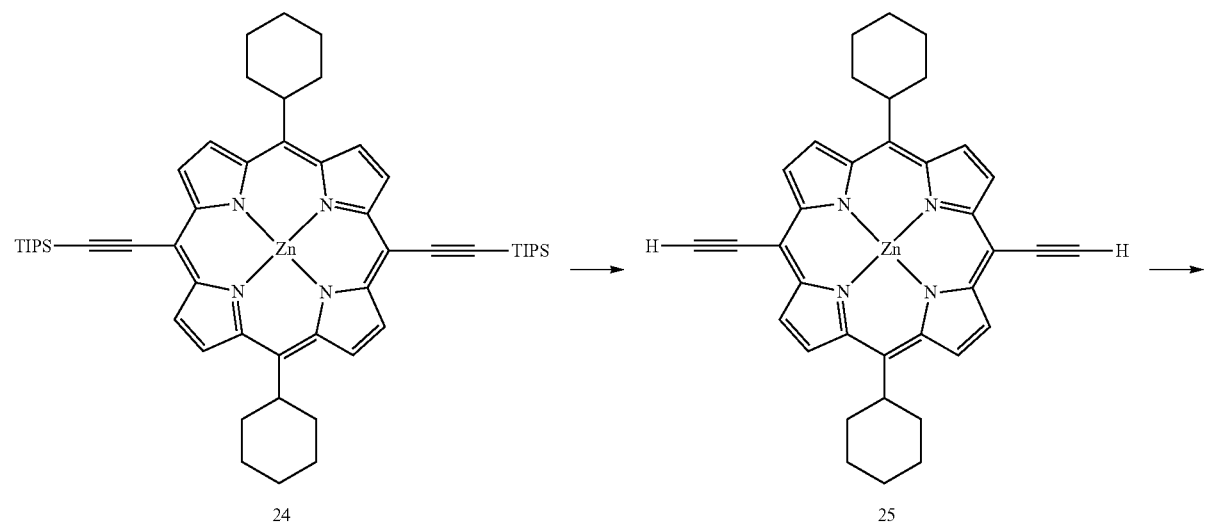

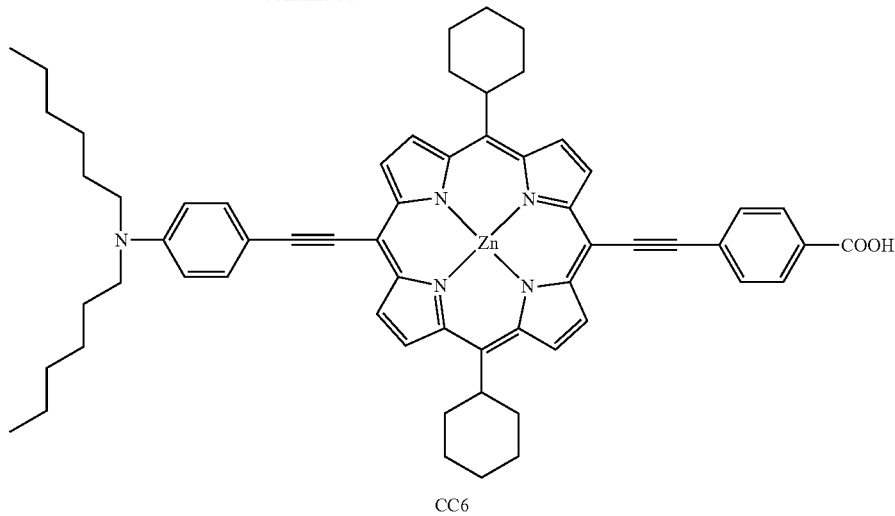

CC6

(1) Synthesis of 5,15-dicyclohexylporphyrin [21]

5 mmole of cyclohexanecarbaldehyde and 5 mmole of dipyrrolmethane were dissolved in 800 mL of dichloromethane and then evenly stirred. 10 g of montmorillonite K10 was then added to the solution in the dark, and the solution was reacted under nitrogen for 2 hours. 7.5 mmole of DDQ was then added into the solution to react for further 1.5 hours. The montmorillonite K10 in the result of reaction was removed by vacuum filtration through silica gel, and the filtrate was re-crystallized by methanol to obtain a purple-red porphyrin compound [21].

(2) Synthesis of 5,15-dibromo-10,20-dicyclohexylporphyrin [22]

0.91 mmole of 5,15-dicyclohexylporphyrin [21] was dissolved in a mixture liquid of 400 mL of dichloromethane and 40 mL of THF and then evenly stirred. 2.28 mmole of NBS was added into the solution and then refluxed at 55° C. overnight. The reaction was cooled to room temperature and then terminated by 40 mL of methanol. The result of the reaction was condensed by reduced pressure to obtain a crude. The crude was re-crystallized by methanol to obtain a porphyrin compound [22].

(3) Synthesis of (5,15-dibromo-10,20-dicyclohexyl-porphyrinato)zinc(II) [23]

0.69 mmole of 5,15-dibromo-10,20-dicyclohexylporphyrin [22] was dissolved in 250 mL of THF. 3.45 mmole of $Zn(OAc)_2 \cdot 2H_2O$ was dissolved in 25 mL of methanol. The methanol solution was added into the THF solution, and then heated to 55° C. and stirred at 55° C. overnight. The solvent in the result of the reaction was removed by reduced pressure condensation. The solid residue was washed by 25 mL of methanol and collected by filtration, thereby obtaining a porphyrin compound [23].

(4) Synthesis of (5,15-bis (triisopropylsilyl)ethynyl-10,20-dicyclohexylporphyrinato) Zinc(II) [24]

0.36 mmole of the porphyrin compound [23], 1.8 mmole of triisopropylacetylene, 0.29 mmole of $Pd(PPh_3)_2Cl_2$, and 1.26 mmole of CuI were put in a reaction bottle. 25 mL of THF and 2.5 mL of $NEt_3$ were added into the reaction bottle under nitrogen, and the mixture in the reaction bottle was stirred at room temperature for 17 hours to be reacted. The solvent in the result of the reaction was removed by reduced pressure condensation to obtain a crude. The crude was purified by chromatography with an eluent of dichloromethane/n-hexane (v/v=1:3) to obtain a purple solid of porphyrin compound [24].

(5) Synthesis of (5,15-dicyclohexyl-10-(4-(N,N-dihexylamino)-phenylethynyl)-20-(4-carboxyphenyl-ethynyl)porphyrinato) Zinc(II) [CC6]

0.167 mmole of porphyrin compound [24] was dissolved in 10 mL of THF. 1.67 mL of 1M TBAF solution (in THF) was then injected into the porphyrin compound [24] solution, and then stirred at room temperature for 60 minutes. A small amount of water was added into the reaction to terminate the reaction. The result of the reaction was extracted by water and dichloromethane. The organic layer of the extraction was collected and dried by anhydrous $MgSO_4$. The solvent of the organic layer was removed by condensation, thereby obtaining a porphyrin compound [25] for the next reaction.

0.167 mmole of 4-iodobenzoic acid, 0.05 mmole of $Pd_2(dba)_3$, and 0.42 mmole of $AsPh_3$ were added to the above porphyrin compound [25]. 0.167 mmole of N,N-dihexyl-4-iodobenzenamine and 20 mL of THF were mixed and then added into the mixture containing the porphyrin compound [25]. 4 mL of $NEt_3$ was then injected into the above mixture. The mixture was then heated to 70° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=20:1) to obtain a green solid of porphyrin compound [CC6].

The porphyrin compound [CC6] was identified and analyzed as indicated below: $^1$H NMR (d-THF, 400 MHz) δ 9.74 (m, 8H), 8.28 (d, 2H), 8.12 (d, 2H), 7.84 (d, 2H), 6.87 (d, 2H), 5.29 (m, 2H), 3.45 (t, 4H), 3.25-3.16 (m, 4H), 2.28 (m, 6H), 2.19 (m, 2H), 2.05-1.89 (m, 8H), 1.41 (m, 14H), 1.29 (s, 2H), 0.97 (m, 6H).

Example 5 (Synthesis of C10-CC6 Dye)
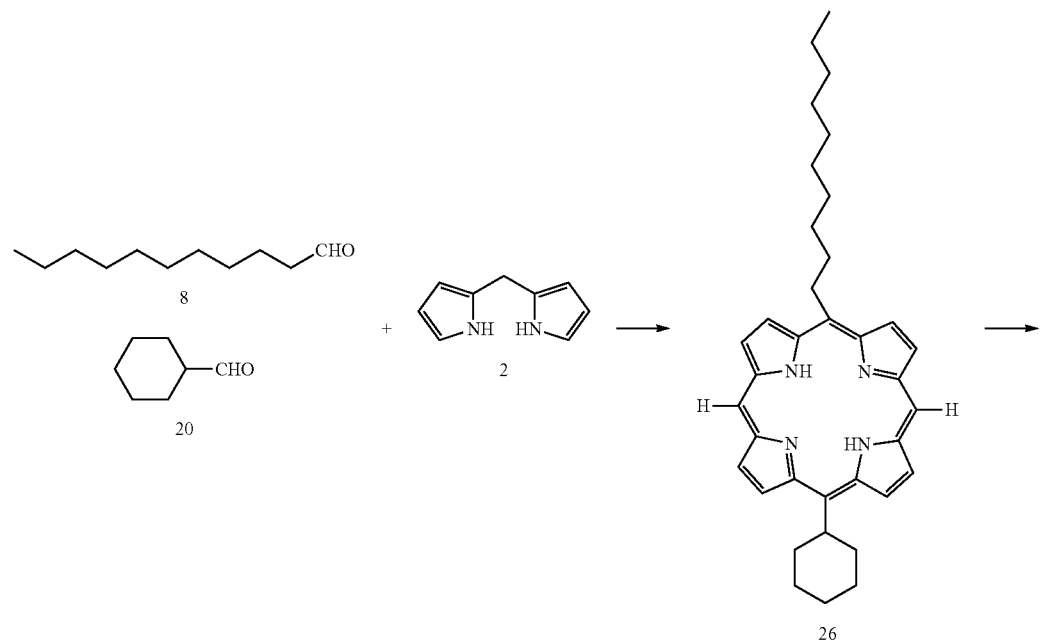
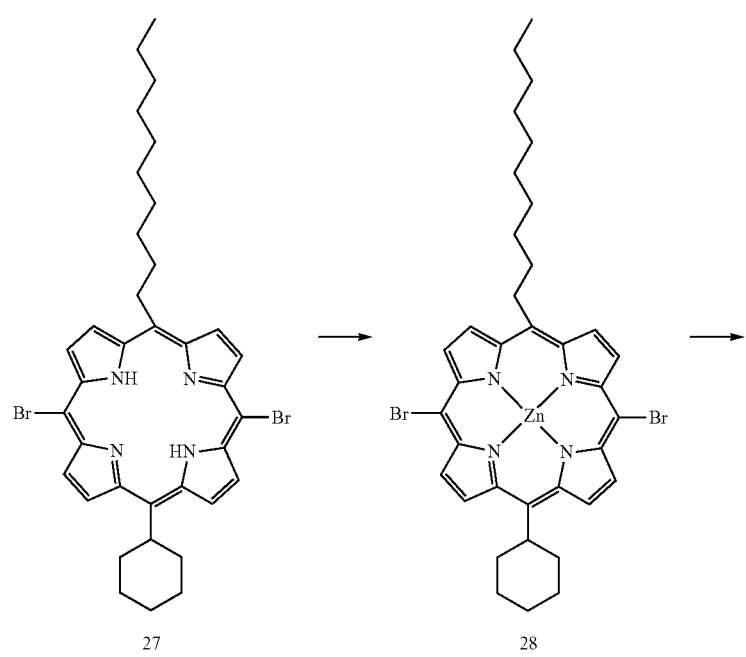

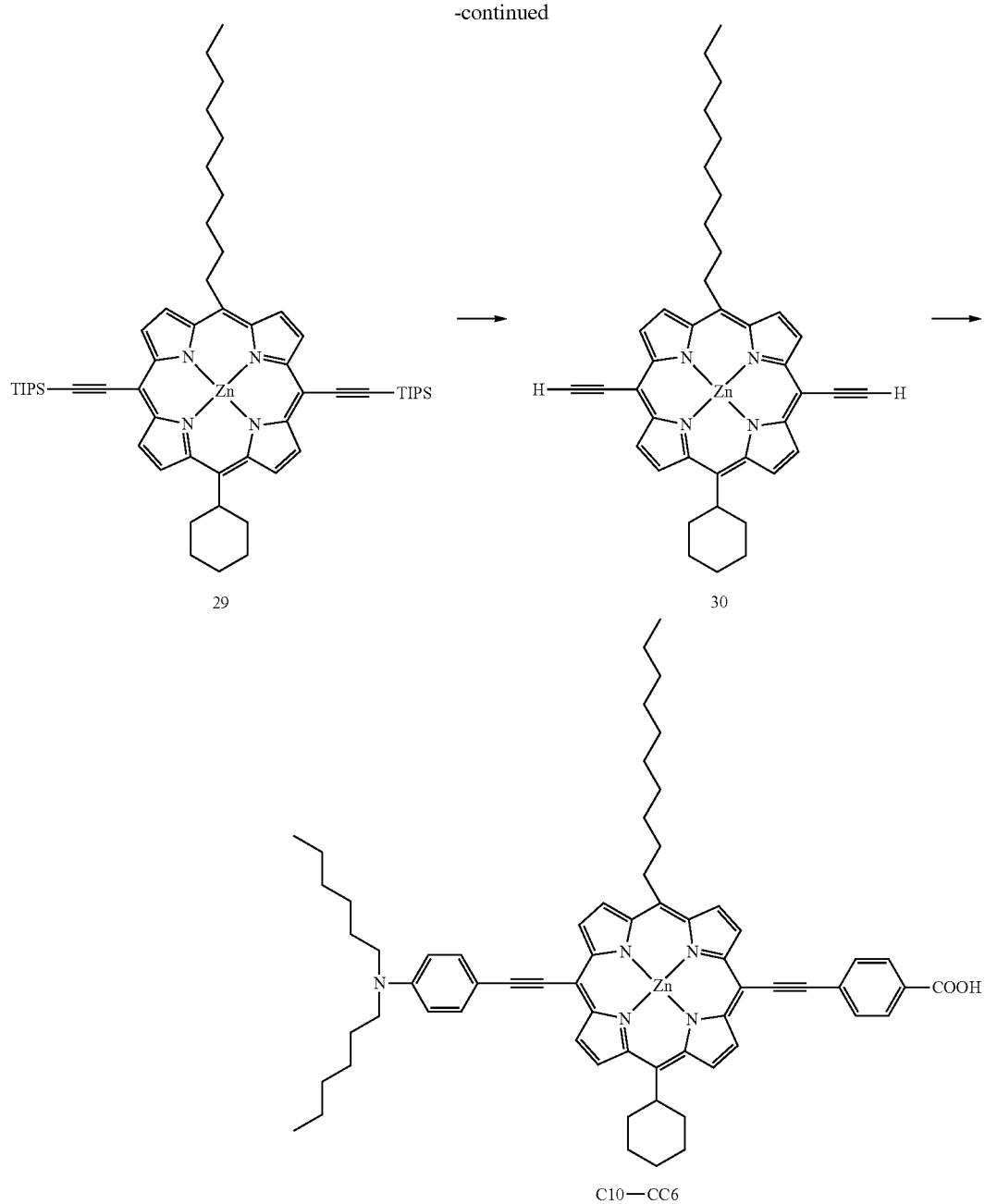

(1) Synthesis of 5-cyclohexyl-15-decylporphyrin [26]

2.5 mmole of undecanal, 2.5 mmole of cyclohexanecarbaldehyde and 5 mmole of dipyrrolmethane were dissolved in 800 mL of dichloromethane and then evenly stirred. 10 g of montmorillonite K10 was then added to the solution in the dark, and the solution was reacted under nitrogen for 2 hours. 7.5 mmole of DDQ was then added into the solution to react for further 1.5 hours. The montmorillonite K10 in the result of reaction was removed by vacuum filtration through silica gel, and the filtrate was purified by chromatography with an eluent (dichloromethane/n-hexane) to obtain a purple-red porphyrin compound [26].

(2) Synthesis of 5,15-dibromo-10-cyclohexyl-20-decylporphyrin [27]

0.82 mmole of 5-cyclohexyl-15-decylporphyrin [26] was dissolved in 350 mL of dichloromethane and then evenly stirred. 2.05 mmole of NBS was added into the solution and then refluxed at 60° C. for 4 hours. The reaction was cooled to room temperature and then terminated by 30 mL of methanol. The result of the reaction was condensed by reduced pressure to obtain a crude. The crude was recrystallized by methanol to obtain a porphyrin compound [27].

(3) Synthesis of (5,15-dibromo-10-cyclohexyl-20-decylporphyrinato)zinc(II) [28]

0.3 mmole of 5,15-dibromo-10-cyclohexyl-20-decylporphyrin [27] was dissolved in 70 mL of THF. 1.5 mmole of Zn(OAc)$_2$.2H$_2$O was dissolved in 7 mL of methanol. The methanol solution was added into the THF solution, and then heated to 60° C. and stirred at 60° C. overnight. The solvent in the result of the reaction was removed by reduced pressure condensation. The solid residue was washed by 20 mL of methanol and collected by filtration, thereby obtaining a porphyrin compound [28].

(4) Synthesis of (5,15-bis(triisopropylsilyl)ethynyl-10-cyclohexyl-20-decylporphyrinato) Zinc(II) [29]

0.29 mmole of the porphyrin compound [28], 1.45 mmole of triisopropylacetylene, 0.23 mmole of Pd(PPh$_3$)$_2$Cl$_2$, and 1.02 mmole of CuI were put in a reaction bottle. 20 mL of THF and 2 mL of NEt$_3$ were added into the reaction bottle under nitrogen, and the mixture in the reaction bottle was stirred at room temperature for 15 hours to be reacted. The solvent in the result of the reaction was removed by condensation to obtain a crude. The crude was purified by chromatography with an eluent of dichloromethane/n-hexane (v/v=1:3) to obtain a purple solid of porphyrin compound [29].

(5) Synthesis of (5-cyclohexyl-15-decyl-10-(4-(N,N-dihexylamino)-phenylethynyl)-20-(4-carboxyphenylethynyl)porphyrinato) Zinc(II) [C10-CC6]

0.143 mmole of porphyrin compound [29] was dissolved in 10 mL of THF. 1.43 mL of 1M TBAF solution (in THF) was then injected into the porphyrin compound [29] solution, and then stirred at room temperature for 60 minutes. A small amount of water was added into the reaction to terminate the reaction. The result of the reaction was extracted by water and dichloromethane. The organic layer of the extraction was collected and dried by anhydrous MgSO$_4$. The solvent of the organic layer was removed by condensation, thereby obtaining a porphyrin compound [30] for the next reaction.

0.143 mmole of 4-iodobenzoic acid, 0.043 mmole of Pd$_2$(dba)$_3$, and 0.36 mmole of AsPh$_3$ were added to the above porphyrin compound [30]. 0.143 mmole of N,N-dihexyl-4-iodobenzenamine and 20 mL of THF were mixed and then added into the mixture containing the porphyrin compound [30]. 4 mL of NEt$_3$ was then injected into the above mixture. The mixture was then heated to 70° C. to be reacted for about 7 hours, and then slowly cooled to room temperature. The solvent in the result of the reaction was removed by condensation. The residual part in the result of the reaction was purified by chromatography with an eluent of dichloromethane/methanol (v/v=18:1), and then re-crystallized by methanol to obtain a green solid of porphyrin compound [C10-CC6].

The porphyrin compound [C10-CC6] was identified and analyzed as indicated below: $^1$H NMR (d-THF, 400 MHz) δ 9.77 (m, 6H), 9.56 (dd, 2H), 8.28 (d, 2H), 8.19 (d, 2H), 7.89 (d, 2H), 6.92 (d, 2H), 5.34 (m, 1H), 5.02 (t, 2H), 3.50 (t, 4H), 1.49-1.44 (m, 15H), 1.39-1.31 (m, 15H), 1.09-1.07 (m, 8H), 1.00 (m, 8H), 0.91 (m, 5H); MALDI-TOF-MS: C$_{65}$H$_{75}$N$_5$O$_2$Zn, m/z: 1021.5 (calc.), 1021.4 (measurement, [M]$^+$).

Example 6 (Synthesis of C5+2 Dye (Branched C7 Dye))

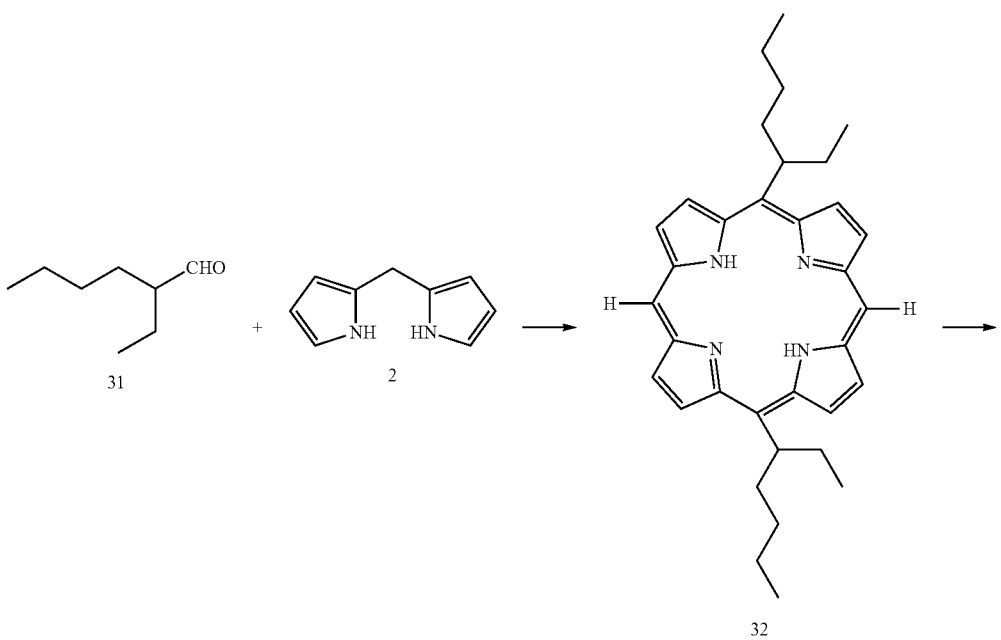

31                                                              32
-continued
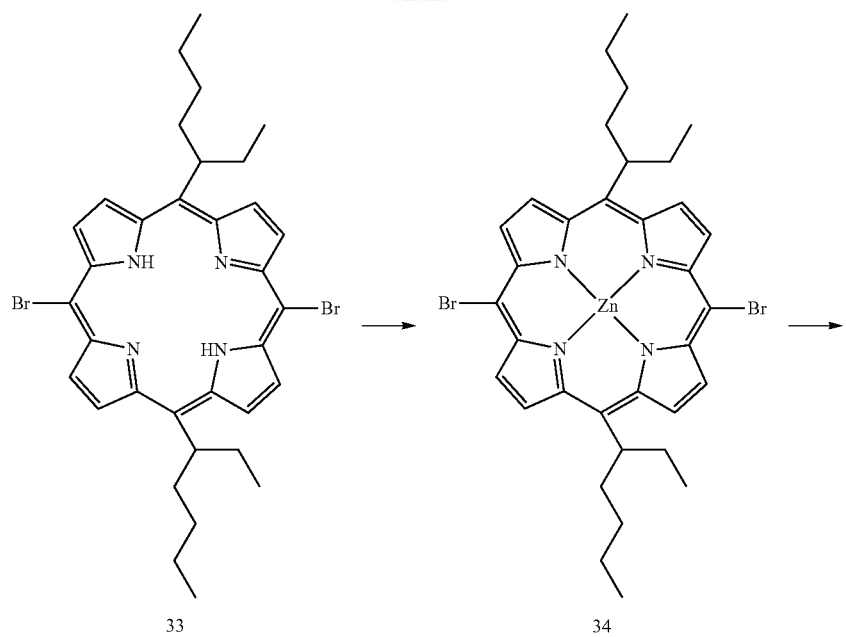
33                                                                  34
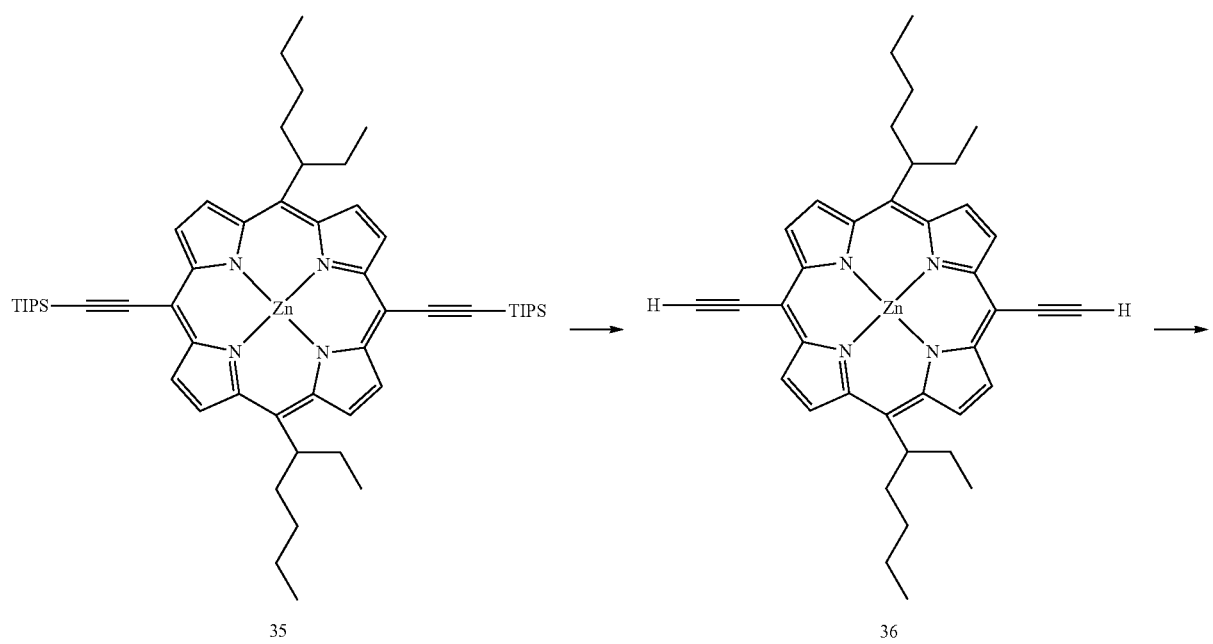
35                                                                  36

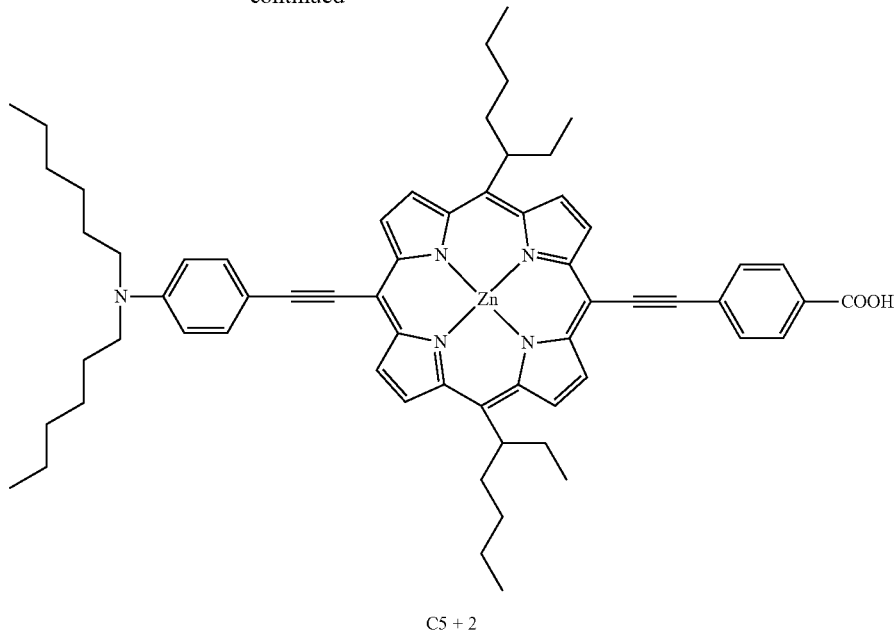

C5 + 2

(1) Synthesis of 5,15-di(2-ethylpentyl)porphyrin [32]

5 mmole of 2-ethylhexanal and 5 mmole of dipyrrolmethane were dissolved in 800 mL of dichloromethane and then evenly stirred. 10 g of montmorillonite K10 was then added to the solution in the dark, and the solution was reacted under nitrogen for 2 hours. 7.5 mmole of DDQ was then added into the solution to react for further 1.5 hours. The montmorillonite K10 in the result of reaction was removed by vacuum filtration through silica gel, and the filtrate was re-crystallized by methanol to obtain a purple-red porphyrin compound [32].

(2) Synthesis of 5,15-dibromo-10,20-di(2-ethylpentyl)porphyrin [33]

0.88 mmole of 5,15-di(2-ethylpentyl)porphyrin [32] was dissolved in 300 mL of dichloromethane and then evenly stirred. 2.2 mmole of NBS was added into the solution and then refluxed at 60° C. for 4 hours. The reaction was cooled to room temperature and then terminated by 30 mL of methanol. The result of the reaction was condensed by reduced pressure to obtain a crude. The crude was re-crystallized by methanol to obtain a porphyrin compound [33].

(3) Synthesis of (5,15 -dibromo-10,20-di(2-ethylpentyl)porphyrinato)zinc(II) [34]

0.27 mmole of 5,15-dibromo-10,20-di(2-ethylpentyl)porphyrin [33] was dissolved in 55 mL of THF. 1.35 mmole of Zn(OAc)$_2$.2H$_2$O was dissolved in 7 mL of methanol. The methanol solution was added into the THF solution, and then heated to 55° C. and stirred at 55° C. overnight. The solvent in the result of the reaction was removed by reduced pressure condensation. The solid residue was washed by 15 mL of methanol and collected by filtration, thereby obtaining a porphyrin compound [34].

(4) Synthesis of (5,15-bis(triisopropylsilyl)ethynyl-10,20-di(2-ethylpentyl)porphyrinato) Zinc(II) [35]

0.22 mmole of the porphyrin compound [34], 1.1 mmole of triisopropylacetylene, 0.165 mmole of Pd(PPh$_3$)$_2$Cl$_2$, and 0.77 mmole of CuI were put in a reaction bottle. 25 mL of THF and 2.5 mL of NEt$_3$ were added into the reaction bottle under nitrogen, and the mixture in the reaction bottle was stirred at room temperature for 19 hours to be reacted. The solvent in the result of the reaction was removed by condensation to obtain a crude. The crude was purified by chromatography with an eluent of dichloromethane/n-hexane (v/v=1:3) to obtain a purple solid of porphyrin compound [35].

(5) Synthesis of (5,15-di(2-ethylpentyl)-10-(4-(N,N-dihexylamino)-phenylethynyl)-20-(4-carboxyphenylethynyl)porphyrinato) Zinc(II) [C5+2]

0.151 mmole of porphyrin compound [35] was dissolved in 10 mL of THF. 1.51 mL of 1M TBAF solution (in THF) was then injected into the porphyrin compound [35] solution, and then stirred at room temperature for 60 minutes. A small amount of water was added into the reaction to terminate the reaction. The result of the reaction was extracted by water and dichloromethane. The organic layer of the extraction was collected and dried by anhydrous MgSO$_4$. The solvent of the organic layer was removed by condensation, thereby obtaining a porphyrin compound [36] for the next reaction.

0.151 mmole of 4-iodobenzoic acid, 0.045 mmole of Pd$_2$(dba)$_3$, and 0.38 mmole of AsPh$_3$ were added to the above porphyrin compound [36]. 0.151 mmole of N,N-dihexyl-4-iodobenzenamine and 20 mL of THF were mixed and then added into the mixture containing the porphyrin compound [36]. 4 mL of NEt$_3$ was then injected into the above mixture. The mixture was then heated to 70° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=18:1), and then re-crystallized by methanol to obtain a green solid of porphyrin compound [C5+2].

The porphyrin compound [C5+2] was identified and analyzed as indicated below: $^1$H NMR (d-THF, 400 MHz) δ 9.79 (m, 6H), 9.71 (m, 2H), 8.28 (d, 2H), 8.19 (d, 2H), 7.89 (d, 2H), 6.92 (d, 2H), 5.29 (m, 2H), 3.50 (t, 4H), 3.04 (m, 5H), 2.82 (m, 5H), 1.47-1.44 (m, 16H), 1.02-0.99 (m, 16H), 0.67-0.64 (m, 8H); MALDI-TOF-MS: $C_{63}H_{73}N_5O_2Zn$, m/z: 995.51 (calc.), 995.42 (measurement, [M]$^+$).

Example 7 (Synthesis of Ph3N-D Dye)

0.128 mmole of porphyrin compound [12] was dissolved in 10 mL of THF. 1.28 mL of 1M TBAF solution (in THF) was then injected into the porphyrin compound [12] solution, and then stirred at room temperature for 60 minutes. A small amount of water was added into the reaction to terminate the reaction. The result of the reaction was extracted by water and dichloromethane. The organic layer of the extraction was collected and dried by anhydrous $MgSO_4$. The solvent of the organic layer was removed by condensation, thereby obtaining a porphyrin compound [13] for the next reaction.

0.128 mmole of 4-bromobenzoic acid, 0.128 mmole of N-(4-bromophenyl)-N-phenylbenzenamine, 0.038 mmole of $Pd_2(dba)_3$, and 0.32 mmole of $AsPh_3$ were added to the above porphyrin compound [13]. 15 mL of THF and 3 mL of $NEt_3$ were sequentially injected into the mixture containing the porphyrin compound [13]. The mixture was then heated to 80° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=20:1) to obtain a green solid of porphyrin compound [Ph3N-D].

The porphyrin compound [Ph3N-D] was identified and analyzed as indicated below: $^1$H NMR (d-THF, 400 MHz) δ 9.79 (m, 6H), 9.61 (m, 6H), 8.29 (d, 2H), 8.21 (d, 2H), 8.11 (d, 1H), 7.96 (d, 1H), 7.64 (t, 2H), 7.54 (t, 1H), 7.39 (t, 2H), 7.26 (d, 2H), 7.15 (t, 1H), 5.07-5.04 (m, 4H), 1.37-1.31 (m, 28H), 0.92-0.86 (m, 10H).

Example 8 (Synthesis of SNC4-D)

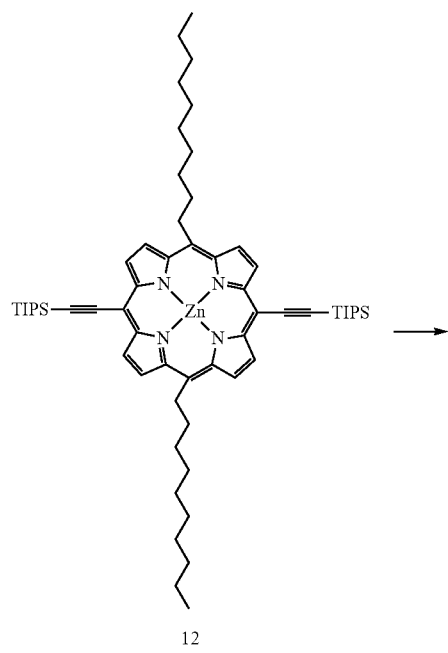

12

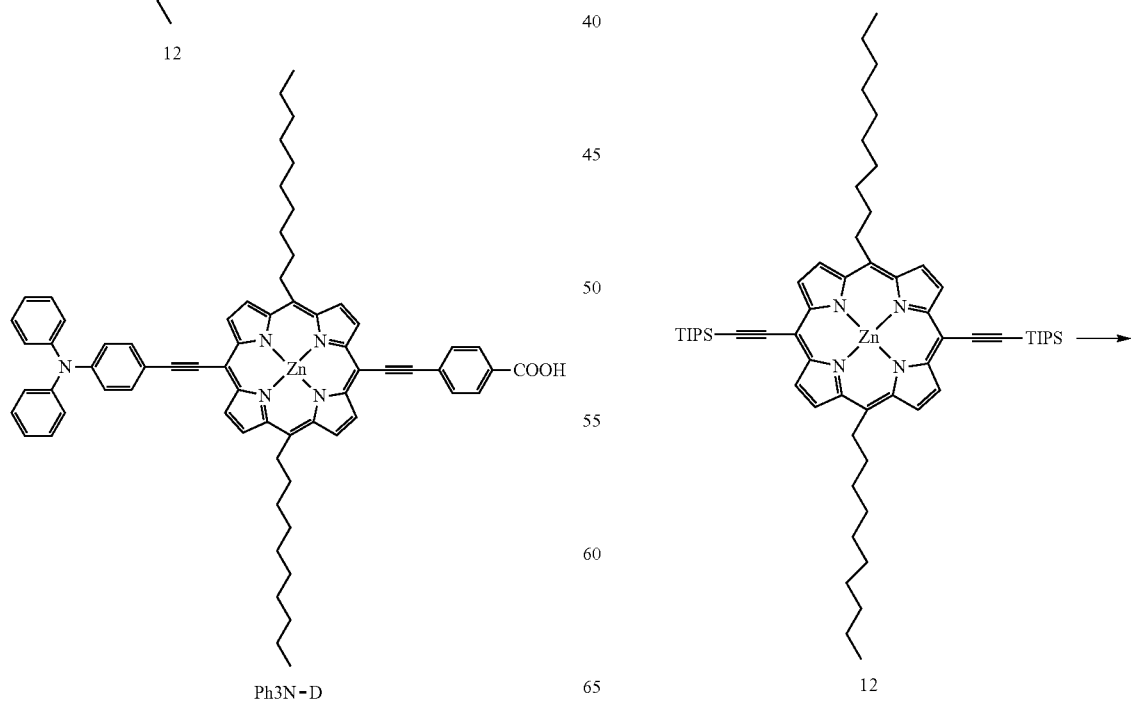

Ph3N-D

12

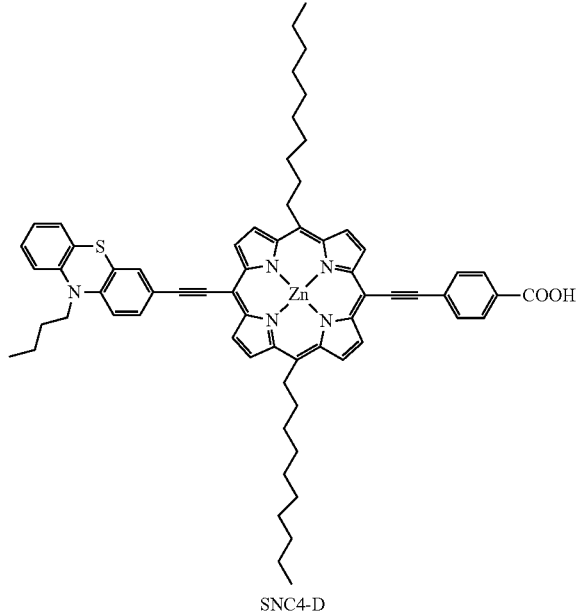

SNC4-D 0.108 mmole of porphyrin compound [12] was dissolved in 10 mL of THF. 1.08 mL of 1M TBAF solution (in THF) was then injected into the porphyrin compound [12] solution, and then stirred at room temperature for 60 minutes. A small amount of water was added into the reaction to terminate the reaction. The result of the reaction was extracted by water and dichloromethane. The organic layer of the extraction was collected and dried by anhydrous MgSO$_4$. The solvent of the organic layer was removed by condensation, thereby obtaining a porphyrin compound [13] for the next reaction.

0.108 mmole of 4-bromobenzoic acid, 0.032 mmole of Pd$_2$(dba)$_3$, and 0.27 mmole of AsPh$_3$ were added to the above porphyrin compound [13]. 0.108 mmole of 3-bromo-10-butyl-10H-phenothiazine and 15 mL of THF were mixed and then added into the mixture containing the porphyrin compound [13]. 3 mL of NEt$_3$ was then injected into the above mixture. The mixture was then heated to 80° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=15:1) to obtain a green solid of porphyrin compound [SNC4-D].

The porphyrin compound [SNC4-D] was identified and analyzed as indicated below: $^1$H NMR (d-THF, 400 MHz) δ 9.80 (m, 4H), 9.56 (m, 4H), 8.32 (d, 2H), 8.20 (d, 2H), 8.12 (d, 2H), 7.63 (t, 2H), 7.54 (d, 2H), 6.95 (s, 1H), 4.98 (s, 4H), 1.60-1.56 (m, 6H), 1.33-1.25 (m, 31H), 0.93-0.89 (m, 10H).

Example 9 (Synthesis of S-A Dye)

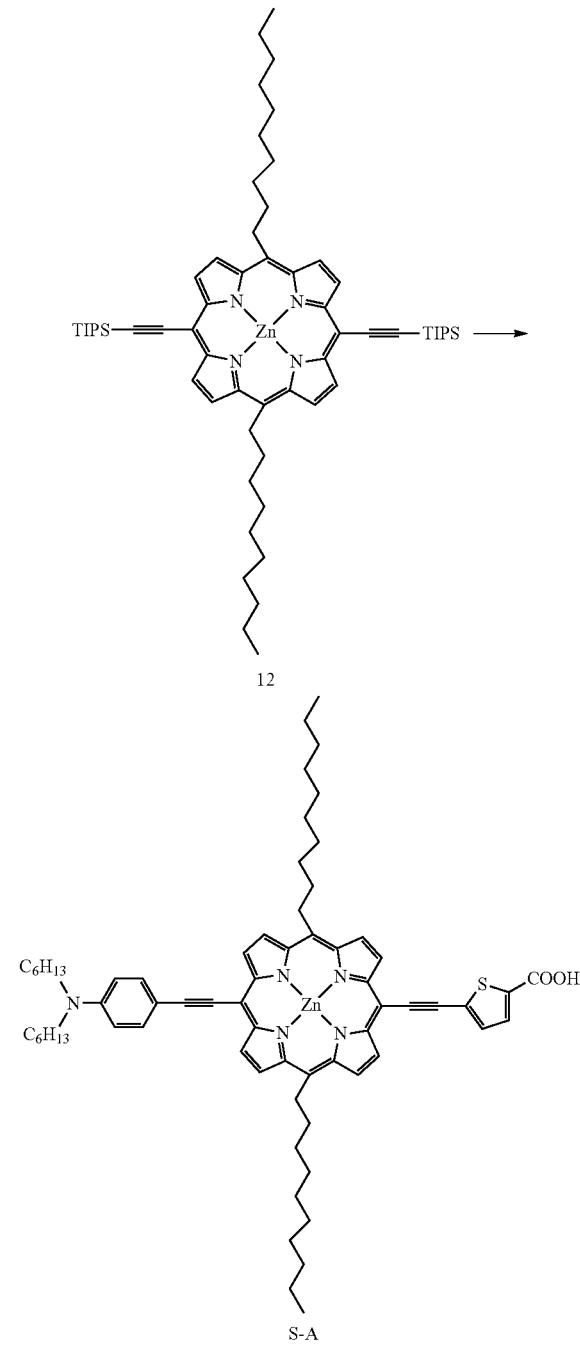

0.173 mmole of porphyrin compound [12] was dissolved in 10 mL of THF. 1.73 mL of 1M TBAF solution (in THF) was then injected into the porphyrin compound [12] solution, and then stirred at room temperature for 60 minutes. A small amount of water was added into the reaction to terminate the reaction. The result of the reaction was extracted by water and dichloromethane. The organic layer of the extraction was collected and dried by anhydrous MgSO$_4$. The solvent of the organic layer was removed by condensation, thereby obtaining a porphyrin compound [13] for the next reaction.

0.173 mmole of 5-bromothiophene-2-carboxylic acid, 0.052 mmole of Pd$_2$(dba)$_3$, and 0.43 mmole of AsPh$_3$ were added to the above porphyrin compound [13]. 0.173 mmole of N,N-dihexyl-4-iodobenzenamine and 25 mL of THF were mixed and then added into the mixture containing the porphyrin compound [13]. 5 mL of NEt$_3$ was then injected into the above mixture. The mixture was then heated to 80° C. to be reacted for about 6 hours, and then slowly cooled to room temperature. The solvent in the result of the reaction was removed by condensation. The residual part in the result of the reaction was purified by chromatography with an eluent of dichloromethane/methanol (v/v=18:1) to obtain a green solid of porphyrin compound [S-A].

The porphyrin compound [S-A] was identified and analyzed as indicated below: $^1$H NMR (d-THF, 400 MHz) δ 9.76 (d, 2H), 9.65 (d, 2H), 9.57 (d, 2H), 9.52 (d, 2H), 7.89 (d, 2H), 7.76 (d, 2H), 6.91 (d, 2H), 5.01 (s, 4H), 3.50 (t, 4H), 1.83 (m, 6H), 1.57 (m, 6H), 1.46-1.31 (m, 36H), 1.02-0.89 (m, 12H).

Test of the DSSC Properties

DSSCs were prepared with the porphyrin compound dyes in Examples 2, 3, 4, and 5 for comparing their photoelectric conversion efficiencies. The DSSCs were prepared with the following steps:

(1) Preparation of a working electrode: An FTO glass was pre-treated by TiCl$_4$, and TiO$_2$ particles with a particle size of 20 nm were coated thereon to form a TiO$_2$ layer with a thickness of 16 μm. Other TiO$_2$ particles with a particle size of 300 nm was then coated on the above TiO$_2$ layer to form a scattering layer with a thickness of 5 μm. The above structure was slowly heated to 490° C. to be sintered, thereby forming a working electrode with an active area of 0.283 cm$^2$.

(2) Preparation of a Pt counter electrode: H$_2$PtCl$_6$ solution was coated on an FTO glass, and then sintered at 400° C. for 20 minutes to complete a Pt counter electrode.

(3) The porphyrin compound dyes in Examples 2, 3, 4, and 5 were each diluted to 0.4 mM. 0.8 mM of co-absorbent (chenodeoxycholic acid, CDCA) and the diluted porphyrin dyes in Examples 2, 3, 4, and 5 were each dissolved in THF to form dye solutions. The working electrodes were each dipped in these dye solutions at 25° C. for 3 hours.

(4) Preparation of an electrolyte: 0.05 M of LiI, 0.03 M of I2, 1.0 M of 1,3-dimethylimidazolium iodide (DMII), and 0.5 M of 4-tert-butylpyridine (TBP) were evenly dissolved in acetonitrile to complete an electrolyte.

(5) Surlyn thermoplastic film (commercially available from SOLARONIX) with a thickness of 60 μm was selected as a sealant. After being dipped into the dye solution, the working electrode was connected to the Pt counter electrode by a thermal press. The electrolyte was injected into the space between the working electrode and the Pt counter electrode, and the above structure was sealed by a UV glue to complete the DSSC.

A sunlight simulator YSS-100A (commercially available from Yamashita) was set to AM 1.5 and 100 mW/cm$^2$ to measure the I-V curve and the photoelectric conversion efficiency of the DSSCs, respectively. The short circuit current ($J_{SC}$), open circuit voltage ($V_{oc}$), filling factors (FF), and photoelectric conversion efficiency (η) of the DSSCs with dyes in Examples 2, 3, 4, and 5 are tabulated in Table 1.

The photoelectric conversion efficiencies of the DSSCs with dyes in Examples 2, 3, 4, and 5 under different simulated sunlight intensities were measured, as tabulated in Table 2.

TABLE 1

(Photoelectric conversion efficiencies of different dyes in Examples)

| Porphyrin compound | Jsc (mA/cm$^2$) | Voc (V) | FF | Photoelectric conversion efficiency (η, %) |
|---|---|---|---|---|
| Example 2 | 10.33 | 0.61 | 0.66 | 4.15 |
| Example 3 | 8.76 | 0.60 | 0.70 | 3.66 |
| Example 4 | 8.42 | 0.59 | 0.68 | 3.41 |
| Example 5 | 5.9 | 0.57 | 0.71 | 2.39 |

TABLE 2

(Photoelectric conversion efficiencies of different dyes in Examples under different sunlight intensities)

| Simulated sunlight intensity | Example 2 | Example 3 | Example 4 | Example 5 |
|---|---|---|---|---|
| 100% | 4.15 | 3.66 | 3.41 | 2.39 |
| 50% | 5.09 | 4.25 | 4.41 | 2.49 |
| 10% | 8.25 | 6.50 | 6.58 | 3.08 |

In addition, not all porphyrin dyes have a greatly increased photoelectric conversion efficiency under weak light (50% and 10%). For example, the conventional dye YD2-o-C8 (Porphyrin-Sensitized Solar Cells with Cobalt (II/III)—Based Redox Electrolyte Exceed 12 Percent Efficiency", Science, 2011, 334, 629-634) only has a little increase in photoelectric conversion efficiency under weak light. Whatever the weak light (50% or 10% simulated sunlight) is, the DSSC with the dye in Example 2 had a larger increase in photoelectric conversion efficiency compared to it under strong light (100% simulated sunlight). The DSSC with the dye in Example 2 had a photoelectric conversion efficiency under 10% simulated sunlight almost twice that under 100% simulated sunlight. However, other conventional dyes do not have such properties, as shown in Table 3.

TABLE 3

| | Sunlight intensity | | |
|---|---|---|---|
| | 100% | 50% | 10% |
| C10 (Example 2) | 1 | 1.23 | 1.99 |
| YD2 | 1 | 1.13 | 1.13 |
| YD2-o-C8 | 1 | 1.07 | 1.05 |

The photoelectric conversion efficiencies of different porphyrin compound dyes under 100% sunlight intensity were set as 1, thereby calculating the photoelectric conversion efficiency increase of the dyes under weak sunlight intensities (e.g. 50% or 10%). As tabulated in Table 3, the dyes of the disclosure have a greatly increased photoelectric conversion efficiency under weak light over conventional dyes.

It will be apparent to those skilled in the art that various modifications and variations can be made to the disclosed methods and materials. It is intended that the specification and examples be considered as exemplary only, with a true scope of the disclosure being indicated by the following claims and their equivalents.

What is claimed is:

1. A porphyrin photosensitive dye, having the chemical formula:

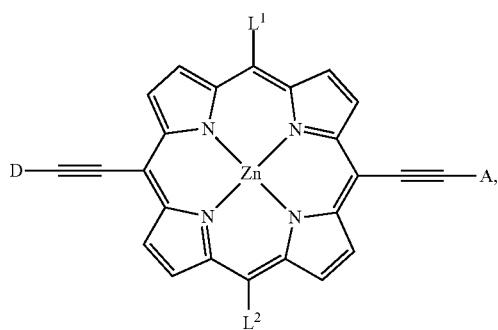

wherein each of L¹ and L² is independently

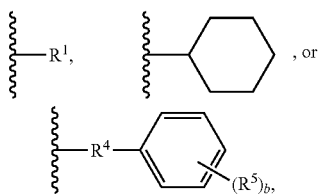

R¹ is $C_{5-20}$ linear or branched alkyl group, R⁴ is $C_{1-20}$ linear or branched alkyl group, R⁵ is $C_{1-20}$ linear or branched alkyl group or $C_{1-20}$ linear or branched alkoxy group, and b is an integer of 0 to 5;

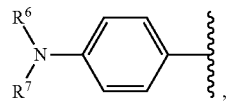

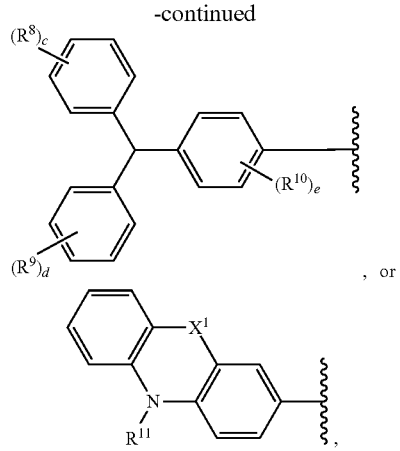

wherein D is
each of R⁶, R⁷, R⁸, R⁹, R¹⁰, and R¹¹ is independently a $C_{1-10}$ alkyl group, X¹ is N, O, S, or Se, and each of c, d, and e is independently an integer of 0 to 5;
wherein A is

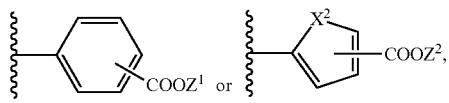

each of Z¹ and Z² is independently hydrogen, alkali metal, or quaternary ammonium salt —$N(R^{12})_4$, wherein R¹² is $C_{1-10}$ alkyl group, and X² is N, O, S, or Se.

2. The porphyrin photosensitive dye as claimed in claim 1, wherein R¹ is $C_{5-10}$ linear or branched alkyl group.

3. The porphyrin photosensitive dye as claimed in claim 1, having the chemical formula:

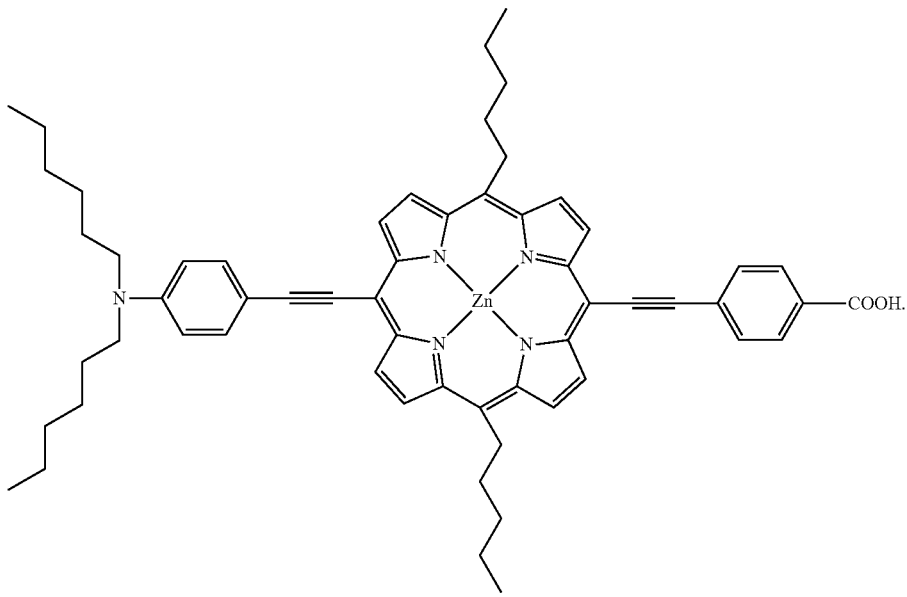

4. The porphyrin photosensitive dye as claimed in claim 1, having the chemical formula:
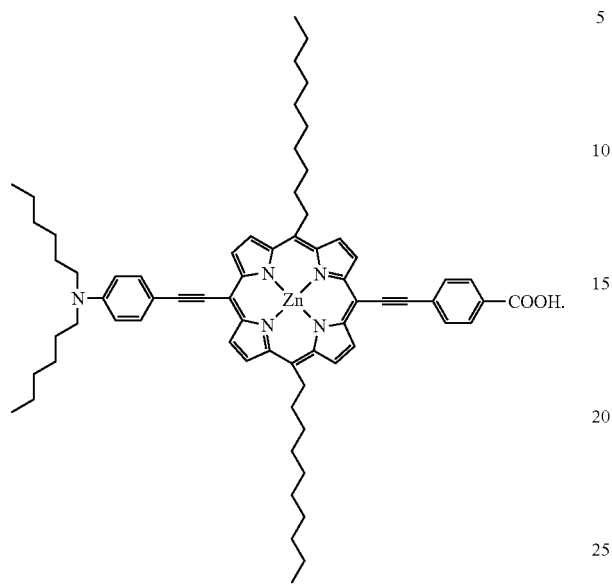
5. The porphyrin photosensitive dye as claimed in claim 1, having the chemical formula:
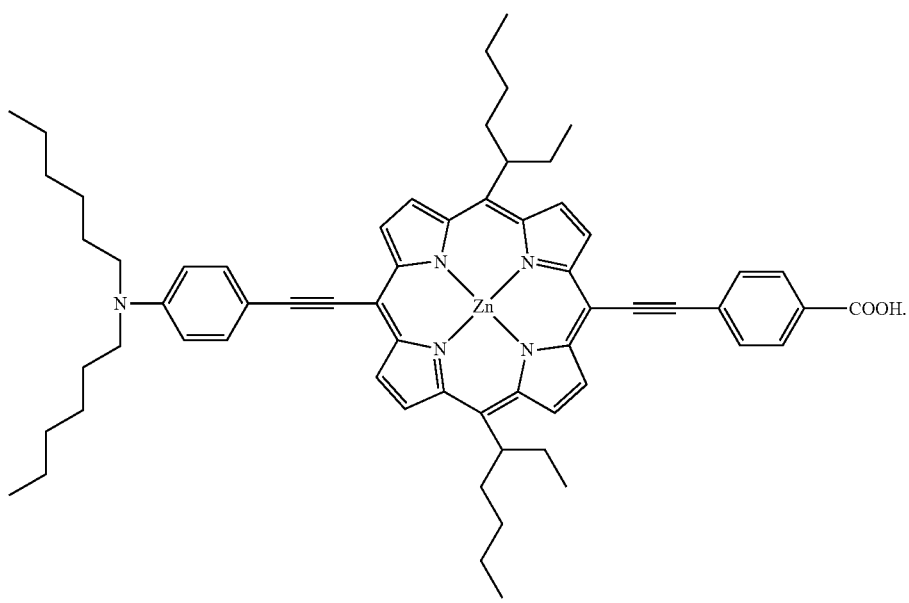
6. The porphyrin photosensitive dye as claimed in claim 1, having the chemical formula:

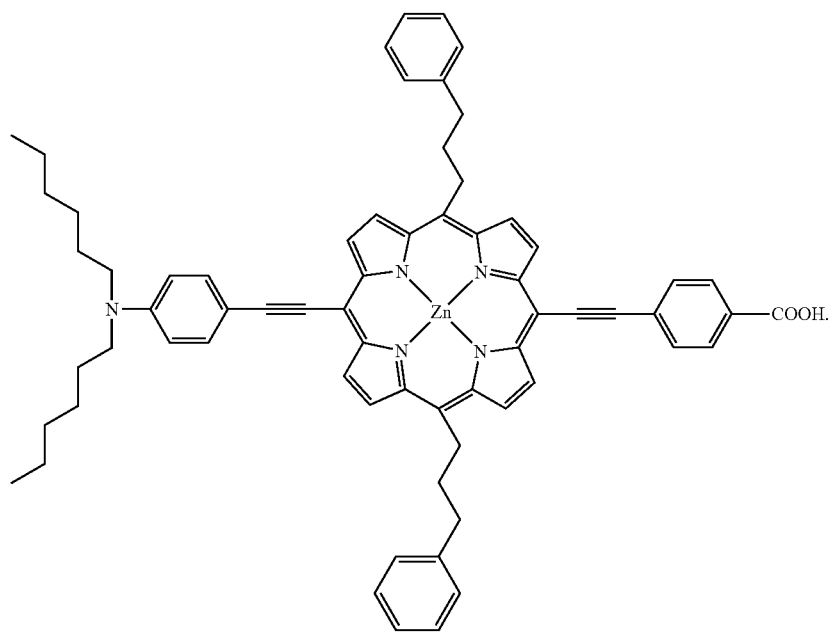
7. The porphyrin photosensitive dye as claimed in claim 1, having the chemical formula:
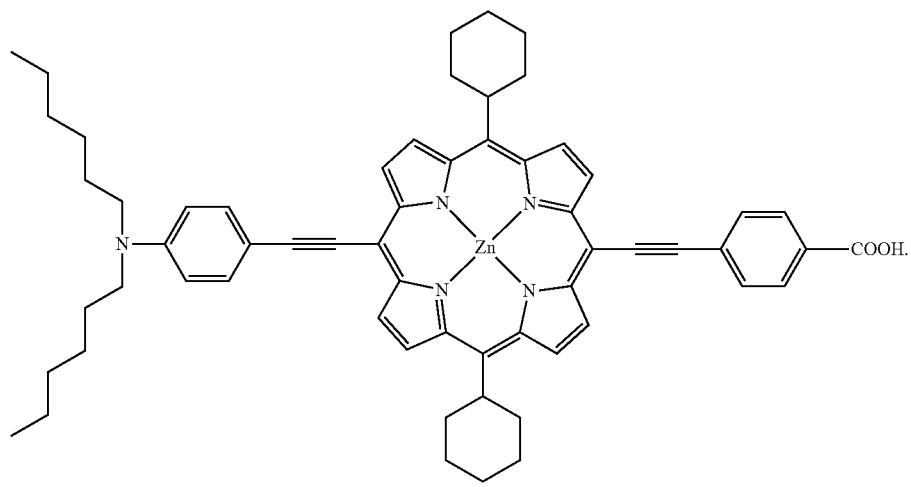
8. The porphyrin photosensitive dye as claimed in claim 1, having the chemical formula:

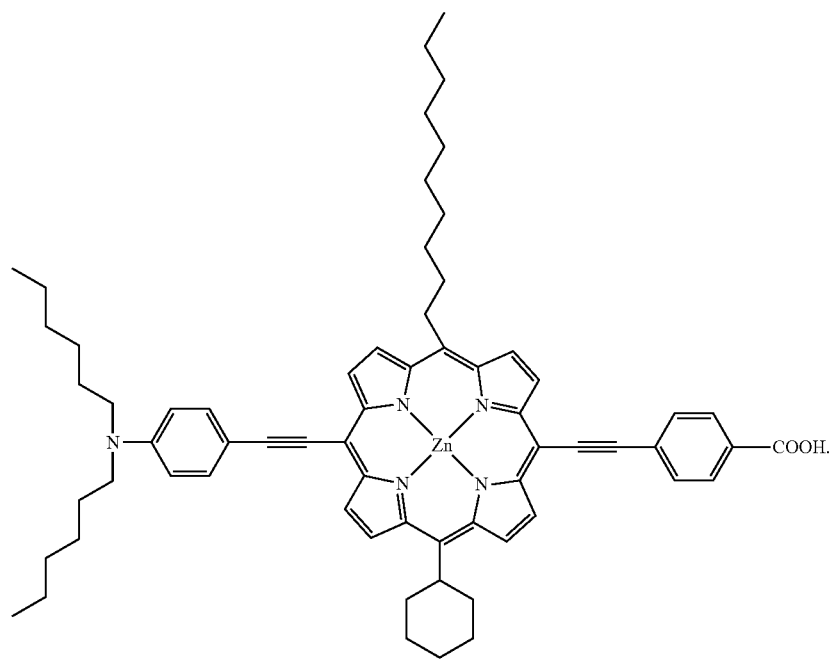
9. The porphyrin photosensitive dye as claimed in claim 1, having the chemical formula:
10. The porphyrin photosensitive dye as claimed in claim 1, having the chemical formula:
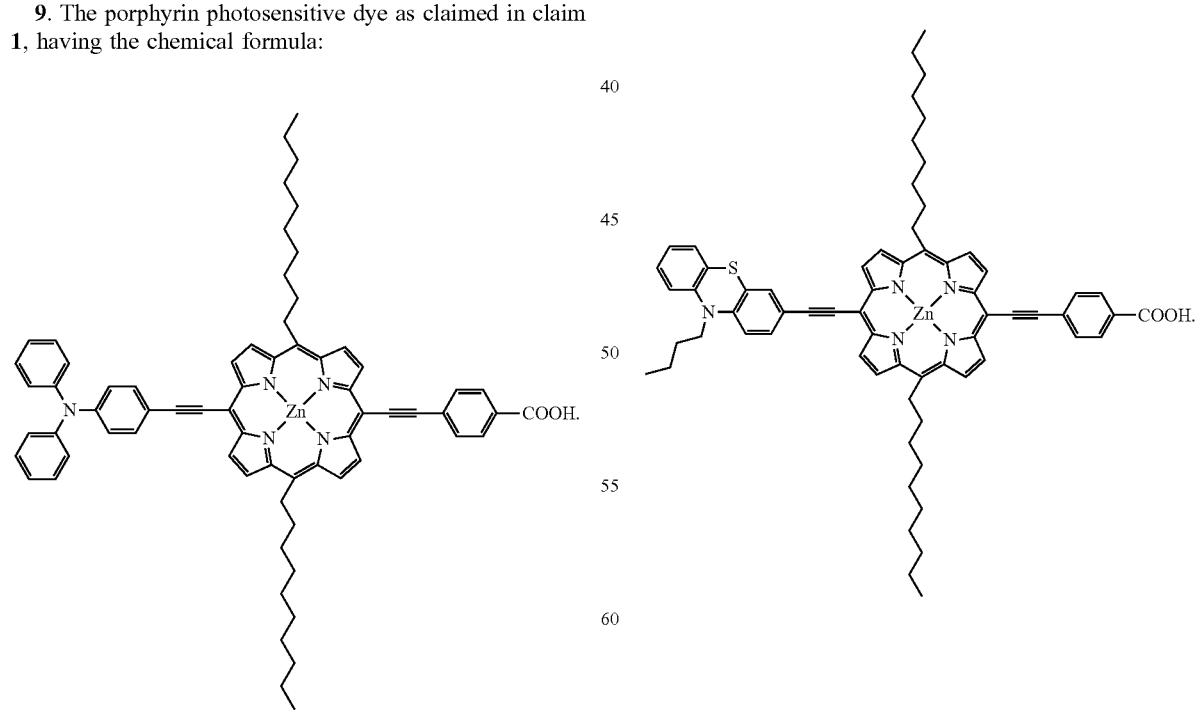
11. The porphyrin photosensitive dye as claimed in claim 1, having the chemical formula:

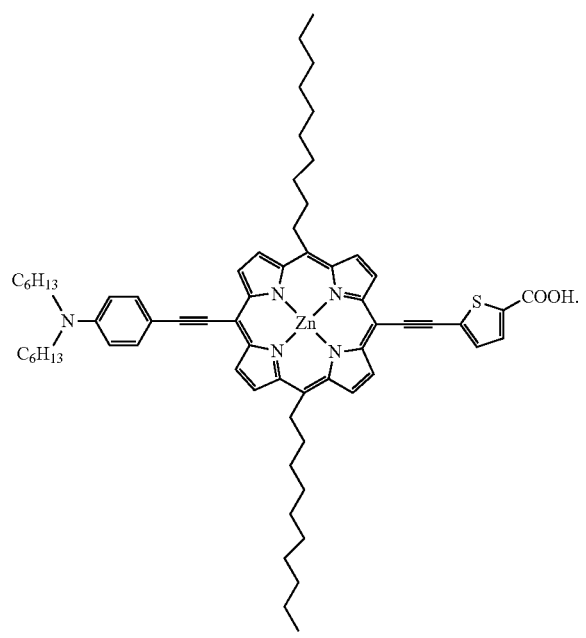
12. A photoelectric conversion device, comprising the porphyrin photosensitive dye as claimed in claim 1.
13. The photoelectric conversion device as claimed in claim 12, comprising an organic light-emitting diode, an organic photovoltaic device, or a dye-sensitive solar cell.
* * * * *